United States Patent
Chang

(10) Patent No.: US 12,381,165 B2
(45) Date of Patent: Aug. 5, 2025

(54) SEMICONDUCTOR STRUCTURE AND METHOD OF MANUFACTURING THE SAME

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 485 days.

(21) Appl. No.: 17/863,648

(22) Filed: Jul. 13, 2022

(65) Prior Publication Data

US 2023/0275053 A1 Aug. 31, 2023

Related U.S. Application Data

(60) Provisional application No. 63/313,961, filed on Feb. 25, 2022.

(51) Int. Cl.
*H01L 23/48* (2006.01)
*H01L 23/00* (2006.01)
(Continued)

(52) U.S. Cl.
CPC .............. *H01L 24/06* (2013.01); *H01L 24/08* (2013.01); *H01L 24/80* (2013.01);
(Continued)

(58) Field of Classification Search
CPC ..... H01L 24/06; H01L 24/80; H01L 25/0657; H01L 2224/80896; H01L 24/08; H01L 2224/08145; H01L 24/05; H01L 2224/09517; H01L 2224/08146; H01L 2224/32145; H01L 2224/08; H01L 2224/0603; H01L 27/14634; H01L 27/1469; H01L 2225/06513; H01L 2224/06051; H01L 2224/16227; H01L 23/49816; H01L 2225/06586; H01L 2224/80127; H01L 2224/80125; H01L 24/16; H01L 24/81; H01L 2224/0401; H01L 2224/08121; H01L 2224/08123; H01L 24/02; H01L 21/2007; H01L 21/486; H01L 2224/06505; H01L 2224/06515;
(Continued)

(56) References Cited

U.S. PATENT DOCUMENTS

2018/0240860 A1* 8/2018 Yang ....................... H01L 24/83
2021/0098405 A1 4/2021 Chu et al.

OTHER PUBLICATIONS

Fukushima et al. "Oxide-Oxide Thermocompression Direct Bonding Technologies with Capillary Self-Assembly for Multichip-to-Wafer Heterogeneous 3D System Integration" Micromachines 2016, 7, 184, published on Oct. 10, 2016.

* cited by examiner

*Primary Examiner* — Niki H Nguyen
(74) *Attorney, Agent, or Firm* — Eschweiler & Potashnik, LLC

(57) ABSTRACT

A semiconductor structure includes a first device structure, an oxide based layer, and a first auxiliary bond pad. The first device structure includes a first bonding layer. The oxide based layer is bonded to the first bonding layer of the first device structure. The first auxiliary bond pad is at an interface between the oxide based layer and the first bonding layer of the first device structure.

20 Claims, 32 Drawing Sheets

(51) Int. Cl.
*H01L 23/52* (2006.01)
*H01L 25/00* (2006.01)
*H01L 25/065* (2023.01)
*H01L 29/40* (2006.01)

(52) U.S. Cl.
CPC .......... *H01L 25/0657* (2013.01); *H01L 25/50* (2013.01); *H01L 2224/06517* (2013.01); *H01L 2224/08145* (2013.01); *H01L 2224/80006* (2013.01); *H01L 2224/80895* (2013.01); *H01L 2224/80896* (2013.01)

(58) Field of Classification Search
CPC ... H01L 2224/08058; H01L 2224/0807; H01L 2224/09505; H01L 2224/12105; H01L 2224/13; H01L 2224/16; H01L 2224/13008; H01L 24/14; H01L 24/17; H01L 24/29; H01L 2924/18161; H01L 2224/73253; H01L 2224/13025; H01L 2224/13022; H01L 2224/02371; H01L 2224/16145; H01L 21/76877
See application file for complete search history.

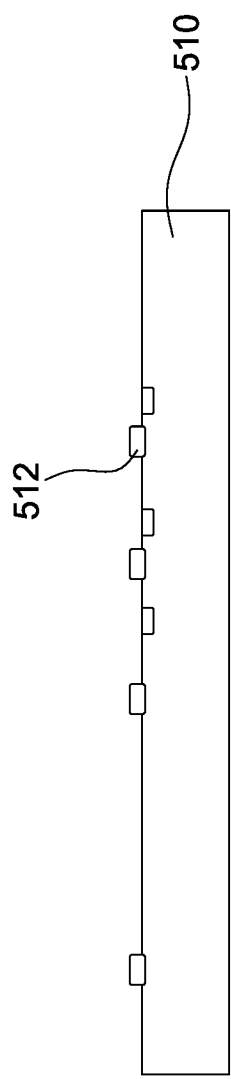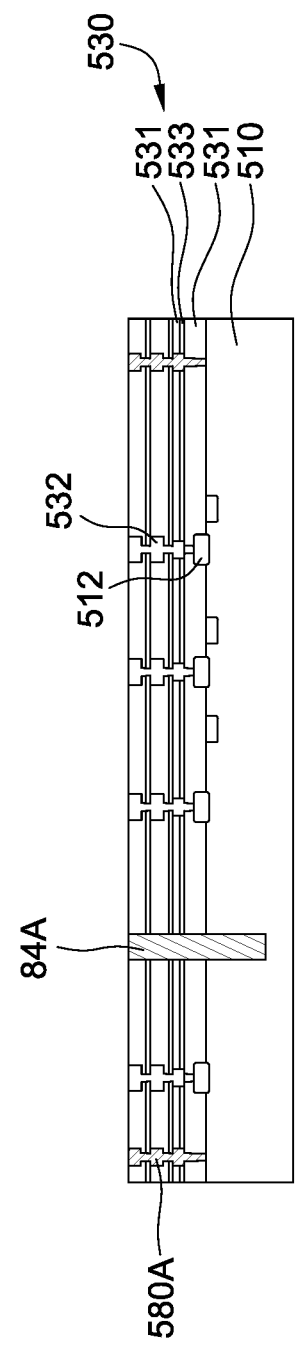

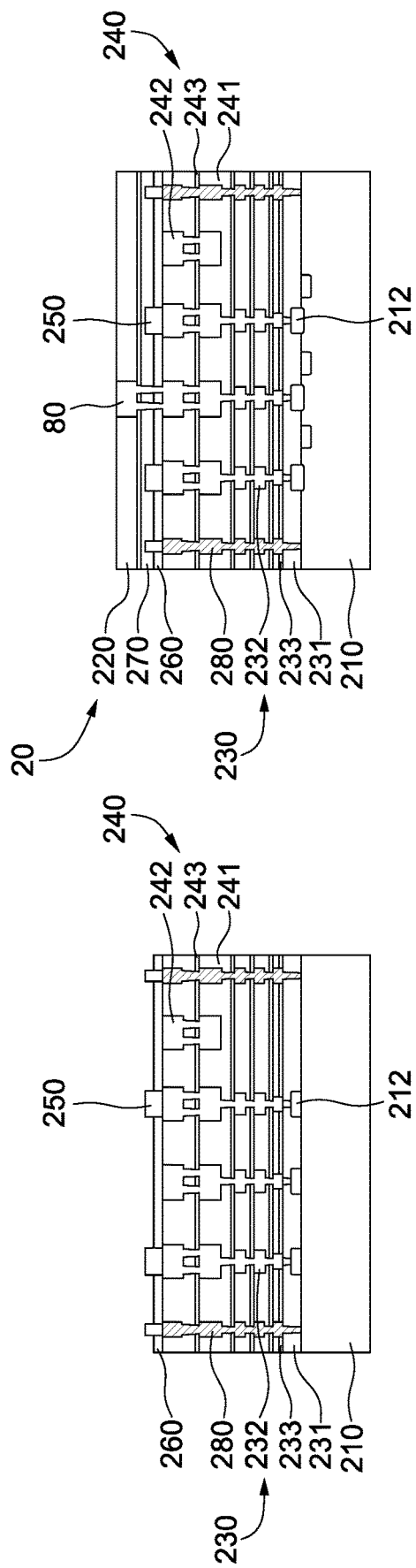

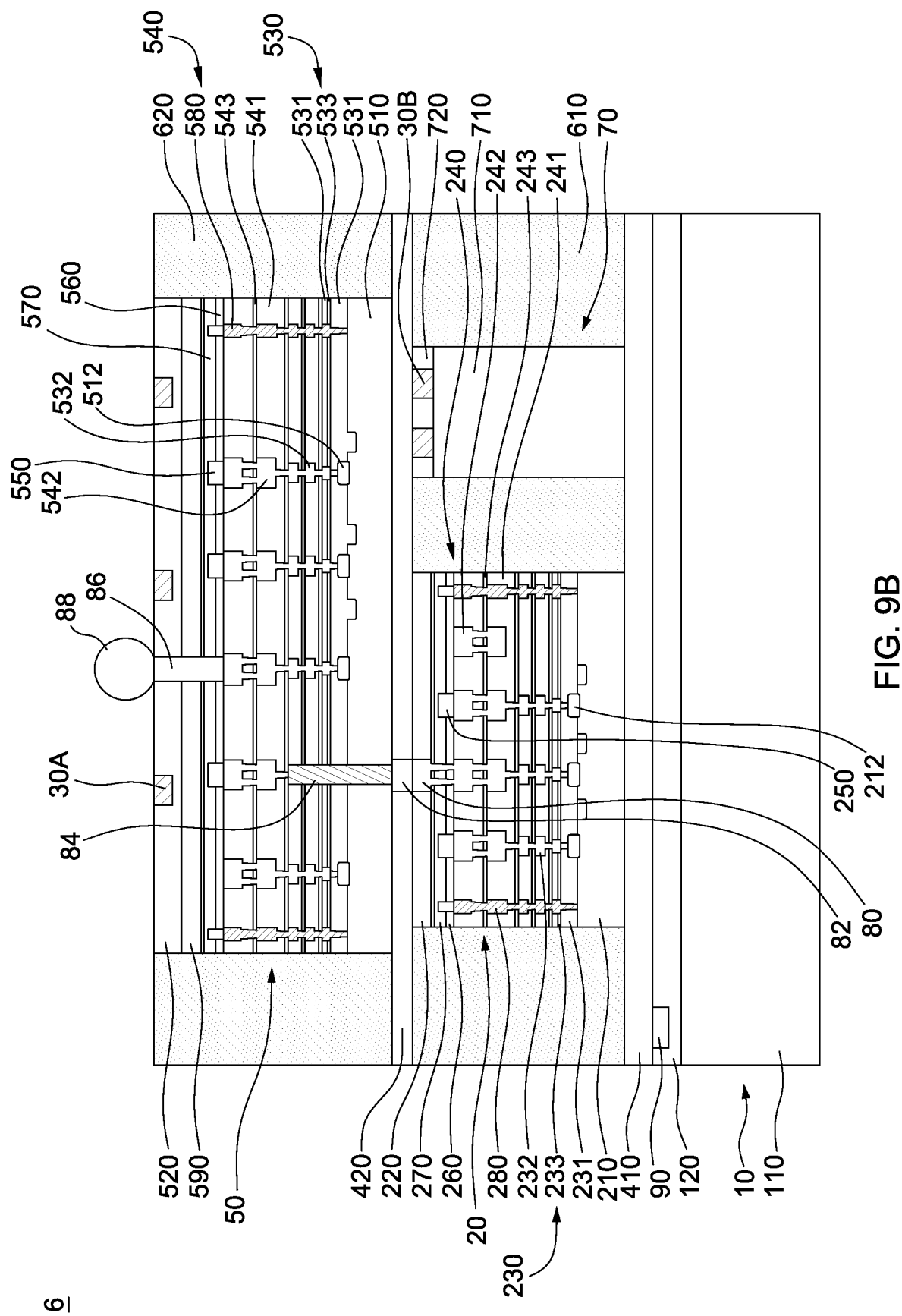

SEMICONDUCTOR STRUCTURE AND METHOD OF MANUFACTURING THE SAME

REFERENCE TO RELATED APPLICATION

This application claims the benefit of U.S. Provisional Application No. 63/313,961, filed on Feb. 25, 2022, the contents of which are hereby incorporated by reference in their entirety.

BACKGROUND

The packages of integrated circuits are becoming increasingly complex, with more device dies integrated in the same package to achieve more functions. For example, System-on-Integrated-Chips (SoIC) have been developed to include a plurality of device dies such as processor dies and memory dies, in the same package. SoICs can include device dies bonded to a common device die to form a system, where the device dies are formed using different technologies and have different functions. The commonly used bonding techniques include direct bonding, chemically activated bonding, plasma activated bonding, anodic bonding, eutectic bonding, glass frit bonding, adhesive bonding, thermo-compressive bonding, reactive bonding, and/or the like. The stacked device dies may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 9A to 9B are cross-sectional views of intermediate stages of a method of manufacturing a semiconductor structure in accordance with some embodiments of the present disclosure.

DETAILED DESCRIPTION

Figure 1A:
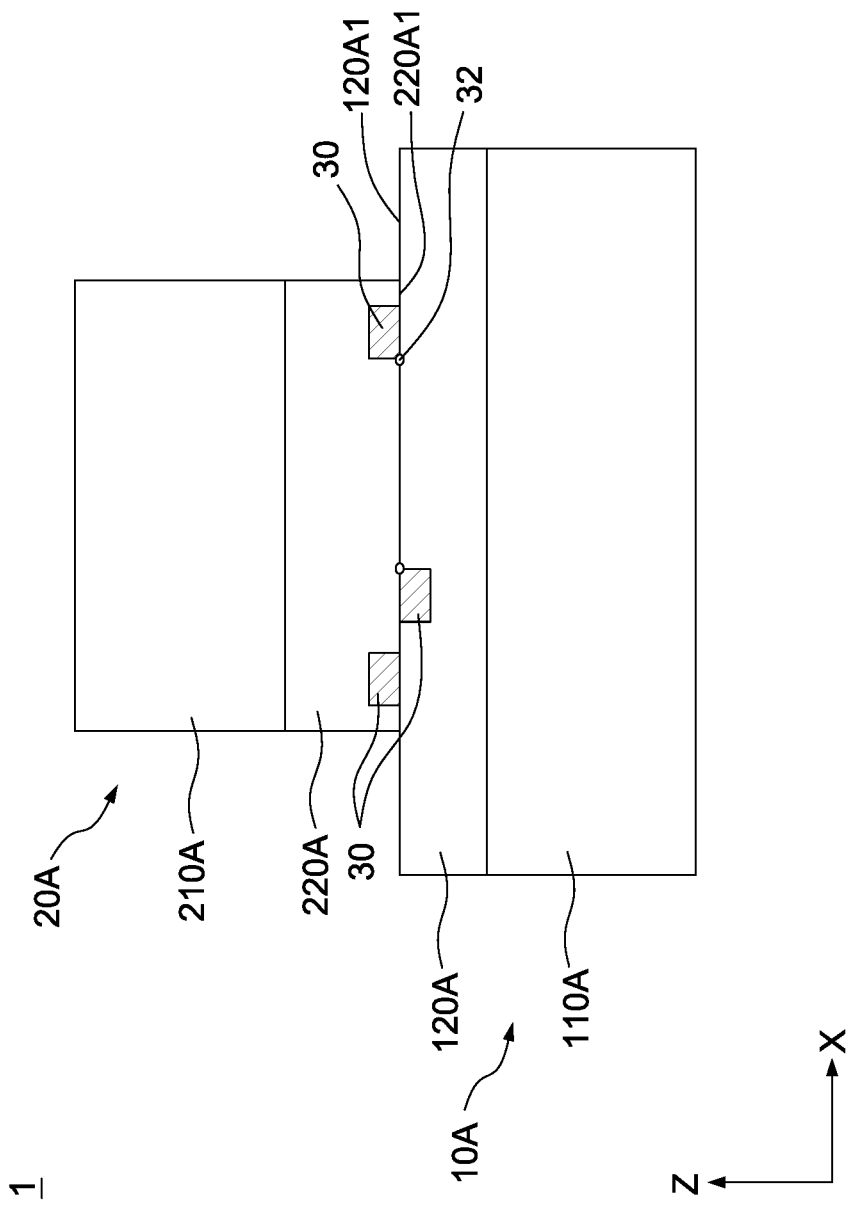
FIG. 1A is a cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In a hybrid bonding process or a fusion bonding process, water ($H_2O$) may be formed as a byproduct from the silanol condensation reaction of hydrogen gas ($H_2$) and silicon (Si) oxidation, and water molecules may be trapped within the bonded structure at or adjacent to the bonding interface. Voids may be generated within the bonded structure due to the trapped water molecules, which may result in defects formed within the bonded structure, and the bonding strength may be adversely affected.

Embodiments of the present disclosure discuss a semiconductor structure including auxiliary bond pads at an interface between the bonding layers. The auxiliary bond pads at the interface between the hybrid bond layers or fusion bond layers can react with oxygen atoms of water molecules and reduce the amount of trapped water molecules within the bonded structure. Therefore, defects generated from the trapped water molecules can be reduced, and thus the bonding strength of the bonding layers can be improved.

FIG. 1A is a cross-sectional view of a semiconductor structure 1 in accordance with some embodiments of the present disclosure.

Referring to FIG. 1A, the semiconductor structure 1 includes a structure 10A, a structure 20A bonded to the structure 10A, and one or more auxiliary bond pads 30.

The structure 10A may be or include one or more device structures including one or more devices. The device structure may be or include one or more integrated circuit devices such as transistors, diodes, resistors, capacitors, and/or the like. The structure 10A may include a carrier 110A and a bonding layer 120A. The carrier 110A may be or include a semiconductor substrate, a semiconductor device, a semiconductor wafer, a package substrate, a package substrate strip, or the like. The bonding layer 120A may be or include a hybrid bond layer or a fusion bond layer. In some embodiments, the bonding layer 120A is or includes an oxide based layer, e.g., a silicon oxide layer or a silicon oxynitride layer. In some embodiments, the bonding layer 120A may further include hybrid bond pads (not shown in FIG. 1A) in the oxide based layer and exposed by a surface 120A1 (also referred to as "a bonding surface") of the bonding layer 120A. The surface 120A1 may be an oxide based bonding surface.

The structure 20A may be or include a device structure including one or more devices. The device structure may be or include one or more integrated circuit devices such as transistors, diodes, resistors, capacitors, and/or the like. The structure 20A may include a carrier 210A and a bonding layer 220A. The carrier 210A may be or include a semiconductor substrate, a semiconductor device, or the like. The bonding layer 220A may be or include a hybrid bond layer or a fusion bond layer. In some embodiments, the bonding layer 220A is or includes an oxide based layer, e.g., a silicon oxide layer or a silicon oxynitride layer. In some embodiments, the bonding layer 220A may further include hybrid bond pads (not shown in FIG. 1A) in the oxide based layer and exposed by a surface 220A1 (also referred to as "a bonding surface") of the bonding layer 220A. The surface 220A1 may be an oxide based bonding surface.

The structure 20A may be bonded to the structure 10A. In some embodiments, the structure (or the device structure) 20A is stacked over and connected to the structure (or the device structure) 10A through the bonding layers 120A and 220A. In some embodiments, the carrier (or the semiconductor device) 210A is stacked over and connected to the carrier (or the semiconductor wafer) 110A through the bonding layers 120A and 220A. In some embodiments the structure 10A is an IC chip and/or the structure 20A is an IC chip.

In some embodiments, the bonding layer 120A is bonded to the bonding layer 220A. In some embodiments, the oxide based layer of the bonding layer 120A is bonded to the oxide based layer of the bonding layer 220A. In some embodiments, the surface (or the oxide based bonding surface) 120A1 of the bonding layer 120A is bonded to the surface (or the oxide based bonding surface) 220A1 of the bonding layer 220A. In some embodiments, the bonding layer 120A is hybrid-bonded or fusion-bonded to the bonding layer 220A.

The auxiliary bond pad 30 may be at an interface between the bonding layer 120A and the bonding layer 220A. In some embodiments, the auxiliary bond pad 30 is at an interface between the oxide based layers of the bonding layers 120A and 220A. In some embodiments, the auxiliary bond pad 30 is at an interface between the surfaces (or the bonding surfaces) 120A1 and 220A1 of the bonding layers 120A and 220A. In some embodiments, the auxiliary bond pad 30 is free from contacting a conductive pad. In some embodiments, the auxiliary bond pad 30 is a dummy conductive pad and is electrically disconnected or isolated from the devices of the structures 10A and 20A. For example, the auxiliary bond pad 30 may be electrically floating. In some embodiments, the auxiliary bond pad 30 is a dummy conductive pad and is electrically disconnected or isolated from the hybrid bond pads in the bonding layers 120A and 220A. In some embodiments, the auxiliary bond pad 30 may include copper (Cu), aluminum (Al), gold (Au), or any other suitable conductive materials that are within the contemplated scope of the disclosure. In some embodiments, the auxiliary bond pad 30 is completely enclosed in dielectric material, such that the auxiliary bond pad 30 does not physically or electrically connected to any conductive features (e.g., vias, other pads, etc.).

In some embodiments, the auxiliary bond pad 30 is completely surrounded by dielectric material. For example, the auxiliary bond pad 30 may be completely surrounded by dielectric material of the first bond layer 120A and dielectric material of the second bond layer 220A. In some embodiments, the auxiliary bond pad 30 is spaced completely from other conductive features (e.g., pads, wires, vias, etc.). In some embodiments, the auxiliary bond pad 30 is inset into one of the first and second bond layers 120A, 220A and has a conductive surface facing the other one of the first and second bond layers 120A, 220A. In at least some of such embodiments, a majority or an entirety of the conductive surface directly contacts the other one of the first and second bond layers 120A, 220A at an elevation level with a bond interface between the first and second bond layers 120A, 220A. The majority may, for example, be greater than 50%, 75%, 90%, or some other suitable percentage of a total surface area of the conductive surface of the auxiliary bond pad 30.

In some embodiments, the auxiliary bond pad 30 is within a range covered by the structure (or the device structure) 20A from a top view perspective. In some embodiments, the auxiliary bond pad 30 is spaced apart from a boundary of the range covered by the structure 20A. In some embodiments, the auxiliary bond pad 30 is in the bonding layer 120A or the bonding layer 220A. In some embodiments, a plurality of the auxiliary bond pads 30 are in the bonding layer 120A and the bonding layer 220A. In some embodiments, the auxiliary bond pad 30 in the bonding layer 120A is bonded to and in contact with the oxide based bonding surface of the bonding layer 220A. In some embodiments, the auxiliary bond pad 30 in the bonding layer 220A is bonded to and in contact with the oxide based bonding surface of the bonding layer 120A. In some embodiments, the auxiliary bond pad 30 in the bonding layer 120A is spaced apart from the auxiliary bond pad 30 in the bonding layer 220A. In some other embodiments, the auxiliary bond pad 30 in the bonding layer 120A may contact and be misaligned with the auxiliary bond pad 30 in the bonding layer 220A from a top view perspective (e.g., along a Z-axis). For example, the auxiliary bond pad 30 in the bonding layer 120A may contact a portion of the auxiliary bond pad 30 in the bonding layer 220A and be offset from the auxiliary bond pad 30 in the bonding layer 220A from a top view perspective (e.g., along the Z-axis).

In some embodiments, the semiconductor structure 1 may further include one or more oxide segments 32. In some embodiments, the oxide segment 32 is proximal to the auxiliary bond pad 30. In some embodiments, the oxide segment 32 directly contacts the auxiliary bond pad 30. In some embodiments, the oxide segment 32 is formed from oxidizing a portion of the auxiliary bond pad 30. In some embodiments, the oxide segment 32 may be or include oxide of the material(s) of the auxiliary bond pad 30. In some embodiments, the oxide segment 32 may include copper oxide, aluminum oxide, or the like. In some embodiments, the material of the oxide segment 32 is different from the material of the oxide based layers of the bonding layers 120A and 220A.

In a hybrid bonding process or a fusion bonding process, water ($H_2O$) may be formed as a byproduct from the silanol condensation reaction of hydrogen gas ($H_2$) and silicon (Si) oxidation, and water molecules may be trapped within the bonded structure at or adjacent to the bonding interface. Voids may be generated within the bonded structure due to the trapped water molecules, which may result in defects formed within the bonded structure. In contrast, according to some embodiments of the present disclosure, the auxiliary bond pads 30 at an interface between the bonding layers 120A, 220A can react with oxygen atoms of water molecules and reduce the amount of trapped water molecules within the bonded structure. Therefore, defects generated from the trapped water molecules can be reduced, and thus the bonding strength of the bonding layers 120A, 220A can be improved. In some embodiments, an insignificant amount of trapped water molecules remains in the bonded structure. In other embodiments, trapped water molecules are completely eliminated from the bonded structure. In some embodiments, unreacted silanol groups persist at a bond interface of the bonded structure.

In addition, according to some embodiments of the present disclosure, the auxiliary bond pads 30 react with water molecules to form oxide segments 32 and hydrogen gas (e.g., the auxiliary bond pads 30 include copper, and the reaction may be represented as follow: $Cu+H_2O \rightarrow CuO+H_2$). Hydrogen gas molecules are relatively small compared to water molecules, and thus it is easier for the hydrogen gas molecules to escape out of the bonded structure instead of being trapped within the bonded structure than for the water molecules. Therefore, defects generated from trapped byproduct molecules within the bonded structure can be reduced. Moreover, the oxide segments 32 as a byproduct remain within the bonded structure in a solid form and in a trace amount. Therefore, defects are not formed from the oxide segments 32, and the bonding strength is not adversely affected by the trace amount of the oxide segments 32.

Furthermore, according to some embodiments of the present disclosure, the auxiliary bond pads 30 in different bonding layers 120A, 220A that are bonded to each other are spaced apart from each other or only partially overlapped and contacting each other. Therefore, the area of the auxiliary bond pads 30 available to react with water molecules generated at the bonding interface can be relatively large, and thus defects generated from the trapped water molecules can be further reduced. In addition, the partially contacting portions between the auxiliary bond pads 30 can enhance the bonding strength.

Figure 1B:
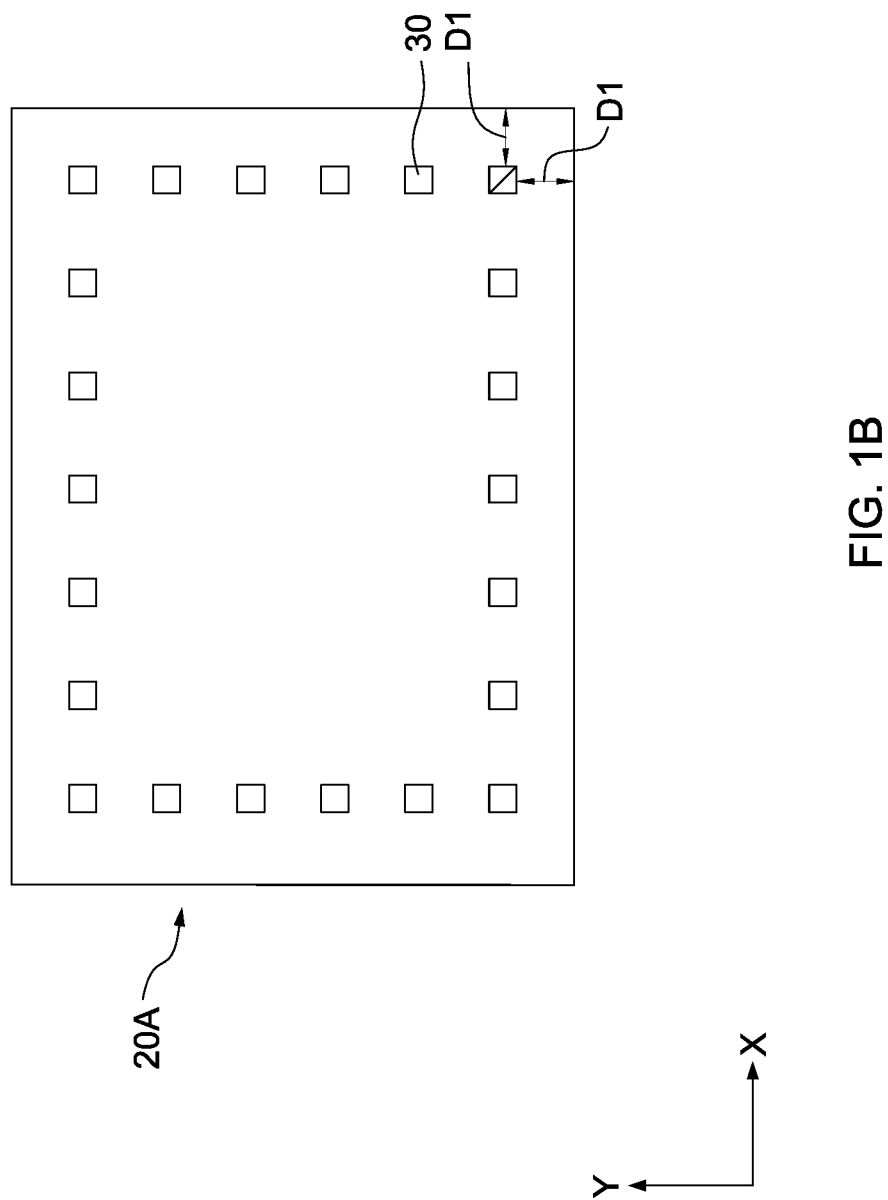
FIG. 1B is a top view of a semiconductor structure in accordance with some embodiments of the present disclosure.

FIG. 1B is a top view of a semiconductor structure in accordance with some embodiments of the present disclosure. In some embodiments, FIG. 1B illustrates a top view of the arrangement of the structure 20A and the auxiliary bond pads 30 of the semiconductor structure 1 in FIG. 1A.

In some embodiments, the auxiliary bond pads 30 are located on a peripheral region of the structure 20A from a top view perspective (e.g., along the Z-axis). In some embodiments, the auxiliary bond pad 30 is spaced apart from a boundary of a range covered by the structure 20A by a distance D1 from a top view perspective. In some embodiments, the distance D1 is about 0.1 μm or greater. In some embodiments, the distance D1 is equal to or greater than about 0.3 μm, about 0.5 μm, about 0.8 μm, or about 1 μm.

In a hybrid bonding process or a fusion bonding process, a bonding layer is brought into contact with another bonding layer followed by pressing the bonding layers from a center region towards a peripheral region so as to bond the bonding layers. As the center region is pressed first, water molecules generated during the bonding process may be pressed and escape out of the bonded structure by diffusing from the center region to the peripheral region, and the center region may have a relatively small amount of trapped water molecules, and the peripheral region may have a relatively large amount of trapped water molecules.

According to some embodiments of the present disclosure, the auxiliary bond pads 30 are located on a peripheral region of the structure 20A, and thus the water molecules trapped in the structure at the peripheral region can be effectively reacted and consumed, and thus the defects can be reduced significantly.

Figure 1C:
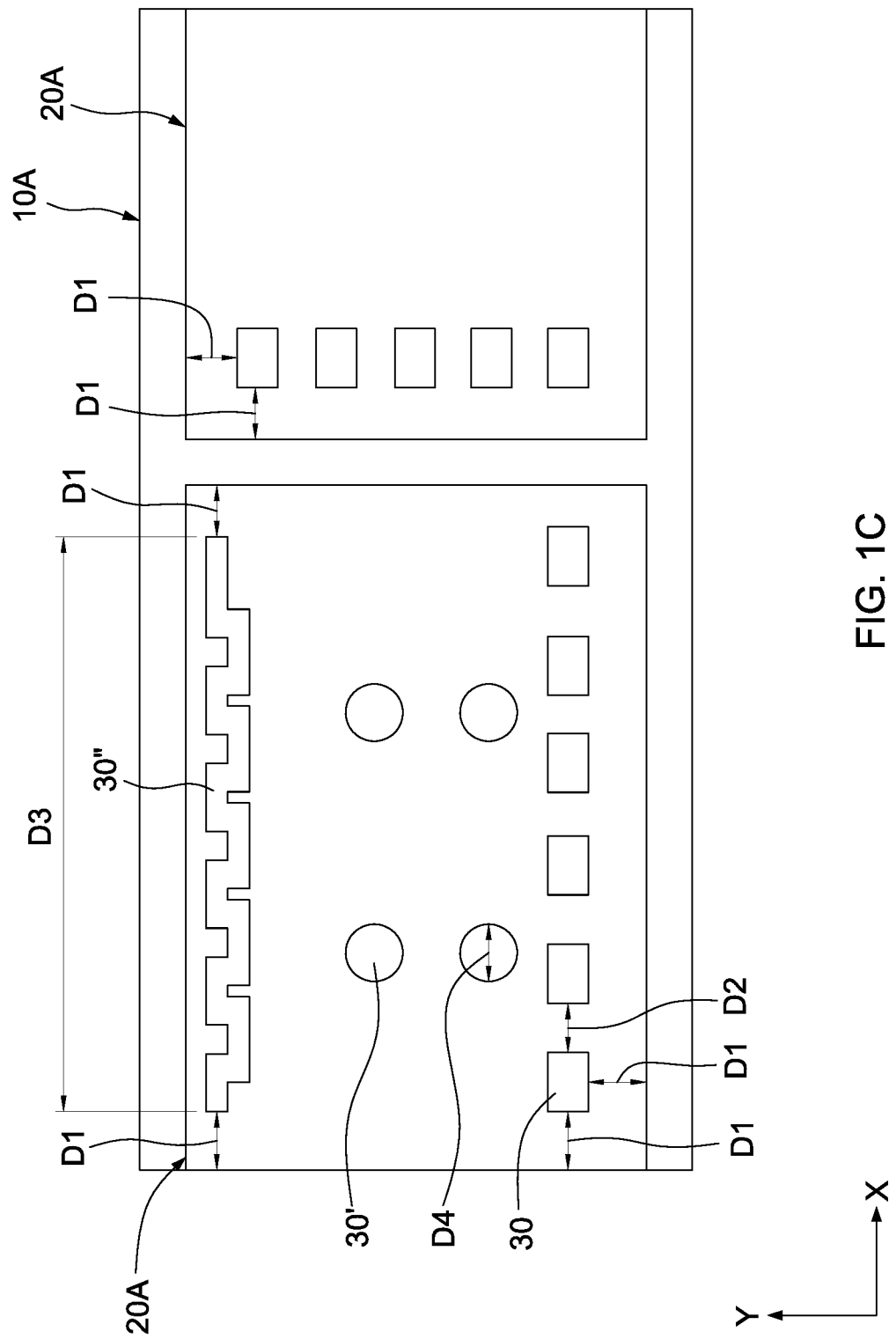
FIG. 1C is a top view of a semiconductor structure in accordance with some embodiments of the present disclosure.

FIG. 1C is a top view of a semiconductor structure in accordance with some embodiments of the present disclosure. In some embodiments, FIG. 1C illustrates a top view of the arrangement of the structure 10A, the structure 20A, and the auxiliary bond pads 30. It should be noted that the arrangement is simply for exemplary purposes and should not be considered limiting. The structures, the numbers, and the positional relationship between the structure 10A, the structure 20A, and the auxiliary bond pads 30 illustrated in FIG. 1C may vary according to actual applications that are within the contemplated scope of the disclosure.

In some embodiments, a plurality of structures 20A may be bonded to the structure 10A. In some embodiments, the auxiliary bond pads 30 are with a range covered by the structures 20A and spaced apart from a boundary of the range covered by the structures 20A by a distance D1 from a top view perspective. In some embodiments, the auxiliary bond pads 30 are spaced apart from an edge or a boundary of the bonding interface between the structure 10A and the structure 20A. The portions of the structure 10A exposed by the structures 20A may be referred to as cutting lines for a subsequent singulation process. In some embodiments, the auxiliary bond pads 30 are spaced apart from the edges of the cutting lines by the distance D1. In some embodiments, the distance D1 is about 0.1 µm or greater. In some embodiments, the distance D1 is equal to or greater than about 0.3 µm, about 0.5 µm, about 0.8 µm, or about 1 µm.

When a plasma etching process is performed along cutting lines of the structure 10A for singulation, undesired plasma arcing may occur when the auxiliary bond pad is disposed too close to the cutting lines and contacted by the plasma, which may cause pollution formed of the melted conductive material (e.g., melted Cu) of the auxiliary bond pad. The pollution may lead to an undesired short-circuit or may flow over the edge and connect to one or more conductive patterns of the structure 20A, and the conductive patterns which are configured for predetermined electrical functions may be undesirably etched away along with the pollution in subsequent etching processes. According to some embodiments of the present disclosure, with the aforesaid design of the distance D1 between the auxiliary bond pad and the boundary or edge of the bonding interface, the pollution caused by undesired plasma arcing can be prevented. In addition, a short-circuit caused by the pollution can be further prevented.

The shapes of the auxiliary bond pads may vary according to actual applications. For example, the shapes of the auxiliary bond pads may vary based on the amount of defects which could have been generated from the trapped water molecules. In some embodiments, the auxiliary bond pads (e.g., auxiliary bond pads 30, 30', and 30") may include the same shape or various different shapes. In some embodiments, the auxiliary bond pad 30 includes a polygonal shape, e.g., a rectangular shape, a rhombus shape, or the like. In some embodiments, the auxiliary bond pad 30' includes a curved shape, e.g., a circular shape, a ring shape, an arc shape, an elliptical shape, or the like. In some embodiments, the auxiliary bond pad 30" include a chain pattern formed of units having different shapes or repeating units having substantially the same shape.

In some embodiments, a distance (or spacing) D2 between adjacent auxiliary bond pads 30 is equal to or greater than about 0.05 µm. The distance (or the spacing) D2 may vary according to the manufacturing process window limit. In some embodiments, a sum of a maximum length D3 of the auxiliary bond pad 30' and two times the distances D1 is equal to or less than a length of a side of the structure 20A. In some embodiments, a minimum dimension D4 (e.g., a minimum width or a minimum diameter) of the auxiliary bond pad is equal to or greater than about 0.05 µm. In some embodiments, a ratio of an area of the auxiliary bond pads to an area of the structure 20A (or an area of the bonding layer 220A) may be equal to or greater than about 0.01%. In some embodiments, a ratio of an area of the auxiliary bond pads to an area of the structure 20A (or an area of the bonding layer 220A) may range about 0.01% to about 90%, from about 0.05% to about 70%, from about 0.1% to about 50%, from about 0.3% to about 30%, from about 0.5% to about 10%, from about 0.8% to about 5%, or from about 1% to about 2%.

While the ratio of an area of the auxiliary bond pads to an area of the structure 20A exceeds 90%, the relatively less bonding strength between the relatively large bonding interface of the auxiliary bond pads and the oxide based bonding surface of the bonding layer may cause delamination. While the ratio of an area of the auxiliary bond pads to an area of the structure 20A is less than 0.01%, the amount of the auxiliary bond pads may be insufficient to reduce defects caused by trapped water molecules. According to some embodiments of the present disclosure, with the aforesaid design of the ratios of the areas, the defects can be reduced significantly, and the delamination due to relatively less bonding strength between the auxiliary bond pads and the oxide based bonding surface can be effectively prevented.

Figure 2:
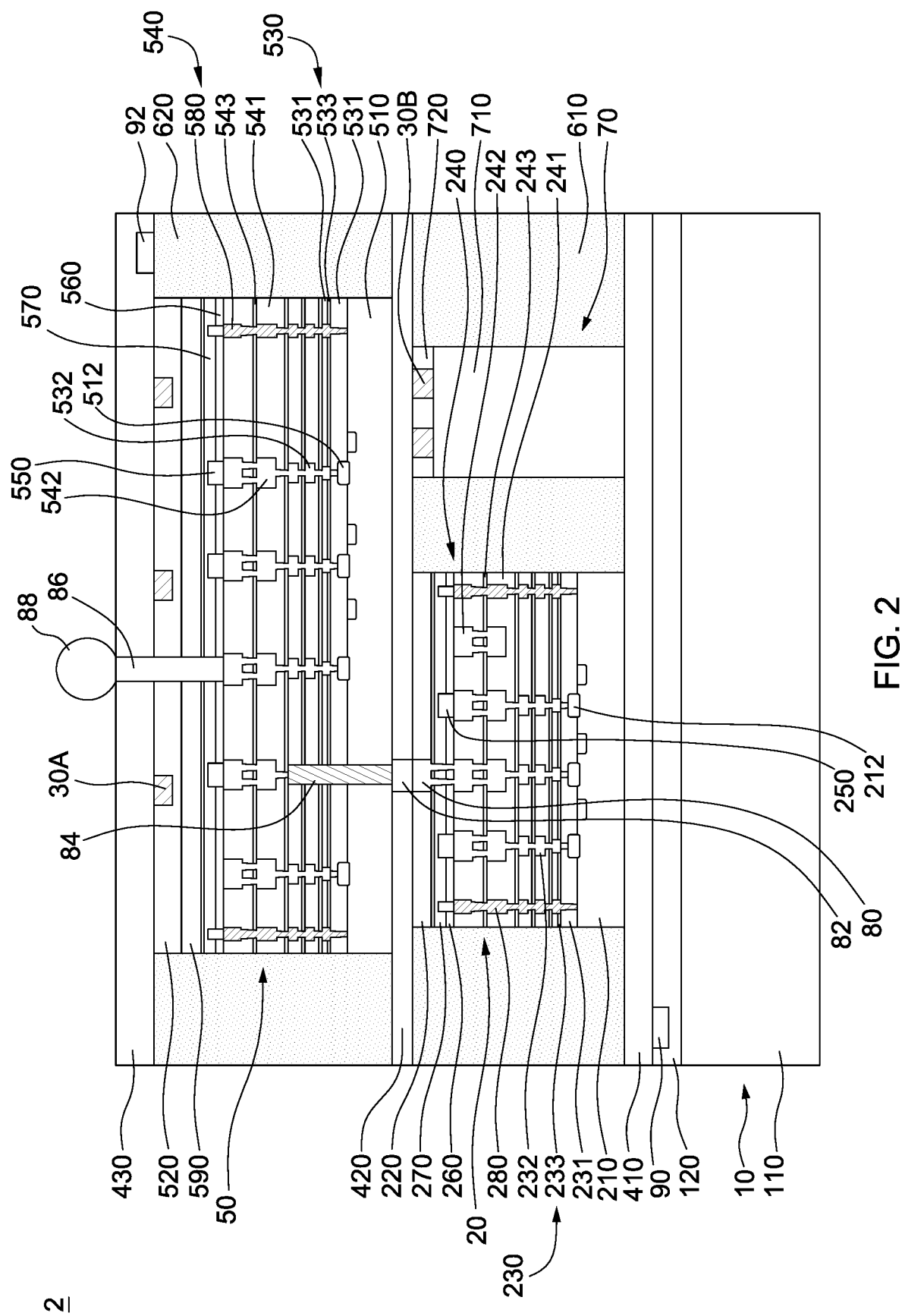
FIG. 2 is a cross-sectional view of a semiconductor structure in accordance with some embodiments of the present disclosure.

FIG. 2 is a cross-sectional view of a semiconductor structure 2 in accordance with some embodiments of the present disclosure.

Referring to FIG. 2, the semiconductor structure 2 includes a structure 10, device structures 20 and 50, auxiliary bond pads 30A and 30B, bonding layers 410, 420, and 430, dielectric structures 610 and 620, a support die 70, conductive bumps 80 and 82, conductive vias 84 and 86, at least an electrical contact 88, and alignment marks 90 and 92.

The structure 10 may include a semiconductor substrate 110 and a bonding layer 120. In some embodiments, the semiconductor substrate 110 may include silicon (Si), germanium (Ge), silicon germanium (SiGe), silicon carbide (SiC), or other proper semiconductor materials. The semiconductor substrate 110 may be a bulk substrate or constructed as a semiconductor on an insulator (SOI) substrate. The semiconductor substrate 110 may include a redistribution layer (RDL), a dielectric structure, or a combination thereof. The RDL may include conductive layers and/or conductive vias. The bonding layer 120 may be configured to be hybrid-bonded or fusion-bonded to another bonding layer. In some embodiments, the bonding layer 120 includes silicon oxide, silicon oxynitride, or any suitable materials configured for hybrid bonding or fusion bonding. In some embodiments, the bonding layer 120 may further include an RDL including conductive layers and/or conductive vias. In some embodiments, the bonding layer 120 may further include hybrid bond pads (not shown in FIG. 2), and the hybrid bond pads may include a material the same as that of the RDL. The alignment mark 90 may be in the bonding layer 120. The alignment mark 90 may be free from overlapping the device structure 20 from a top view perspective (i.e., along the Z-axis).

The bonding layer 410 may include a hybrid bond layer or a fusion bond layer. In some embodiments, the bonding layer 410 includes an oxide based layer. In some embodiments, the bonding layer 410 includes silicon oxide, silicon oxynitride, or any suitable materials configured for hybrid bonding or fusion bonding. In some embodiments, the bonding layer 410 may further include hybrid bond pads (not shown in FIG. 2). In some embodiments, the bonding layer 410 is bonded to the bonding layer 120. In some embodiments, the bonding layer 410 is fusion-bonded to the bonding layer 120.

The device structure 20 may include a semiconductor substrate 210, a bonding layer 220, an interconnection structure 230, an RDL structure 240, conductive pads 250, a passivation layer 260, a gap-filling dielectric layer 270, and a seal ring 280.

The semiconductor substrate 210 may be attached or adhered to the bonding layer 410. In some embodiments, the semiconductor substrate 210 is disposed or formed on the bonding layer 410. In some embodiments, the semiconductor substrate 210 may include Si, Ge, SiGe, SiC, or other proper semiconductor materials. The semiconductor substrate 210 may be a bulk substrate or constructed as an SOI substrate. The semiconductor substrate 210 may include an RDL, a dielectric structure, or a combination thereof. The RDL may include conductive layers and/or conductive vias. The semiconductor substrate 210 may further include one or more devices (e.g., transistors) 212 adjacent to an upper surface of the semiconductor substrate 210. The devices 212 may include integrated circuit devices such as transistors, diodes, resistors, capacitors, and/or the like.

The bonding layer 220 may be on a side of the semiconductor substrate 210 opposite to the structure 10. The bonding layer 220 may be configured to be hybrid-bonded or fusion-bonded to another bonding layer. In some embodiments, the bonding layer 220 includes an oxide based layer. In some embodiments, the bonding layer 220 includes silicon oxide, silicon oxynitride, or any suitable materials configured for hybrid bonding or fusion bonding. In some embodiments, the bonding layer 220 may further include hybrid bond pads (not shown in FIG. 2).

The interconnection structure 230 may electrically connect the devices 212 to the RDL structure 240. In some embodiments, the interconnection structure 230 includes a plurality of dielectric layers 231, a plurality of patterned conductive layers 232, and a plurality of etch stop layers (ESLs) 233. The patterned conductive layers 232 are separated from each other by the dielectric layers 231 and electrically connected to each other through a plurality of conductive vias.

The RDL structure 240 may electrically connect the interconnection structure 230 to the conductive pads 250. In some embodiments, the RDL structure 240 includes a plurality of dielectric layers 241, a plurality of patterned conductive layers 242, and a plurality of ESLs 243. The patterned conductive layers 242 are separated from each other by the dielectric layers 241 and electrically connected to each other through a plurality of conductive vias. The patterned conductive layers 242 may include patterns having a pitch or a line/spacing (L/S) different from that of patterns of the patterned conductive layers 232.

The conductive pads 250 may electrically connect to the patterned conductive layers 242 of the RDL structure 240. The conductive pads 250 may include copper (Cu), aluminum (Al), or any other suitable conductive materials.

The passivation layer 260 may be disposed or formed on the RDL structure 240. In some embodiments, the conductive pads 250 penetrate the passivation layer 260 to electrically connect to the RDL structure 240. The passivation layer 260 may include silicon oxide, silicon nitride, silicon oxynitride, undoped silicon glass (USG), or the like.

The gap-filling dielectric layer 270 may be on the passivation layer 260 and cover the conductive pads 250. In some embodiments, the gap-filling dielectric layer 270 fills the gaps between the conductive pads 250 for providing a substantially planar upper surface. The bonding layer 220 is formed on the gap-filling dielectric layer 270. In some embodiments, an ESL (illustrated, but not labeled due to space constraints) may be between the gap-filling dielectric layer 270 and the bonding layer 220.

The seal ring 280 may penetrate the interconnection structure 230 and the RDL structure 240 and surround a device region of the device structure 20. In some embodiments, the seal ring 280 is formed along a periphery of the device structure 20. In some embodiments, the seal ring 280 is formed by one or more materials the same as the material(s) of the patterned conductive layers 232 and/or the material(s) of the patterned conductive layers 242. The seal ring 280 may serve to protect the devices within the device region from being damaged from moisture.

The conductive bump 80 may be in the bonding layer 220 of the device structure 20. In some embodiments, the conductive bump 80 is electrically connected to a top patterned conductive layer 242 of the RDL structure 240 through one or more conductive vias. The conductive vias may penetrate the ESL, the gap-filling dielectric layer 270, and the passivation layer 260. The conductive bump 80 may include copper (Cu), tungsten (W), cobalt (Co), aluminum (Al), tantalum (Ta), tantalum nitride (TaN), titanium (Ti), titanium nitride (TiN), an alloy thereof, a combination thereof, or the like, or any other suitable conductive materials.

The bonding layer 420 may include a hybrid bond layer or a fusion bond layer. In some embodiments, the bonding layer 420 includes an oxide based layer. In some embodiments, the bonding layer 420 includes silicon oxide, silicon oxynitride, or any suitable materials configured for hybrid bonding or fusion bonding. In some embodiments, the bonding layer 420 may further include hybrid bond pads (not shown in FIG. 2). In some embodiments, the bonding layer 420 is bonded to the bonding layer 220. In some embodiments, the bonding layer 420 is fusion-bonded to the bonding layer 220.

The conductive bump 82 may be in the bonding layer 420. In some embodiments, the conductive bump 82 is electrically connected to the conductive bump 80. The conductive bump 82 may include Cu, W, Co, Al, Ta, TaN, Ti, TiN, an alloy thereof, a combination thereof, or the like, or any other suitable conductive materials.

The device structure 50 may include a semiconductor substrate 510, bonding layers 520 and 590, an interconnection structure 530, an RDL structure 540, conductive pads 550, a passivation layer 560, a gap-filling dielectric layer 570, and a seal ring 580.

The semiconductor substrate 510 may be attached or adhered to the bonding layer 420. In some embodiments, the semiconductor substrate 510 is disposed or formed on the bonding layer 420. In some embodiments, the semiconductor substrate 510 may include Si, Ge, SiGe, SiC, or other proper semiconductor materials. The semiconductor substrate 510 may be a bulk substrate or constructed as an SOI substrate. The semiconductor substrate 510 may include an RDL, a dielectric structure, or a combination thereof. The RDL may include conductive layers and/or conductive vias. The semiconductor substrate 510 may further include one or more devices (e.g., transistors) 512 adjacent to an upper surface of the semiconductor substrate 510. The devices 512 may include integrated circuit devices such as transistors, diodes, resistors, capacitors, and/or the like.

The bonding layers 520 and 590 may be on a side of the semiconductor substrate 510 opposite to the device structure 20. The bonding layers 520 and 590 may be configured to hybrid-bonded or fusion-bonded to another bonding layer. In some embodiments, the bonding layers 520 and 590 include oxide based layers. In some embodiments, the bonding layer 520 includes one or more of the auxiliary bond pads 30A bonded to an oxide based bonding surface of another bonding layer. In some embodiments, each of the bonding layers 520 and 590 includes silicon oxide, silicon oxynitride, or any suitable materials configured for hybrid bonding or fusion bonding. In some embodiments, the bonding layer 520 is fusion-bonded to the bonding layer 590. In some embodiments, the bonding layer 590 may serve as a stress releasing layer.

The interconnection structure 530 may electrically connect the devices 512 to the RDL structure 540. In some embodiments, the interconnection structure 530 includes a plurality of dielectric layers 531, a plurality of patterned conductive layers 532, and a plurality of ESLs 533. The patterned conductive layers 532 are separated from each other by the dielectric layers 531 and electrically connected to each other through a plurality of conductive vias.

The RDL structure 540 may electrically connect the interconnection structure 530 to the conductive pads 550. In some embodiments, the RDL structure 540 includes a plurality of dielectric layers 541, a plurality of patterned conductive layers 542, and a plurality of ESLs 543. The patterned conductive layers 542 are separated from each other by the dielectric layers 541 and electrically connected to each other through a plurality of conductive vias. The patterned conductive layers 542 may include patterns having a pitch or an L/S different from that of patterns of the patterned conductive layers 532.

The conductive pads 550 may electrically connect to the patterned conductive layers 542 of the RDL structure 540. The conductive pads 550 may include Cu, Al, or any other suitable conductive materials.

The passivation layer 560 may be disposed or formed on the RDL structure 540. In some embodiments, the conductive pads 550 penetrate the passivation layer 560 to electrically connect to the RDL structure 540. The passivation layer 560 may include silicon oxide, silicon nitride, silicon oxynitride, USG, or the like.

The gap-filling dielectric layer 570 may be on the passivation layer 560 and cover the conductive pads 550. In some embodiments, the gap-filling dielectric layer 570 fills the gaps between the conductive pads 550 for providing a substantially planar upper surface. The bonding layer 590 is formed on the gap-filling dielectric layer 570. In some embodiments, a ESL may be between the gap-filling dielectric layer 570 and the bonding layer 590.

The seal ring 580 may penetrate the interconnection structure 530 and the RDL structure 540 and surround a device region of the device structure 50. In some embodiments, the seal ring 580 is formed along a periphery of the device structure 50. In some embodiments, the seal ring 580 is formed by one or more materials the same as the material(s) of the patterned conductive layers 532 and/or the material(s) of the patterned conductive layers 542. The seal ring 580 may serve to protect the devices within the device region from being damaged from moisture.

The conductive via 84 may penetrate the semiconductor substrate 510 and the interconnection structure 530 of the device structure 50. In some embodiments, the conductive via 84 electrically connects the RDL structure 540 to the conductive bump 82. In some embodiments, the conductive via 84 is electrically connected to a bottom patterned conductive layer 542 of the RDL structure 540 through one or more conductive vias. The conductive vias may penetrate the ESL 543 and the dielectric layer 541. The conductive via 84 may include Cu, W, Co, Al, Ta, TaN, Ti, TiN, an alloy thereof, a combination thereof, or the like, or any other suitable conductive materials.

The dielectric structure 610 may be between the bonding layer 410 and the bonding layer 420. In some embodiments, the dielectric structure 610 covers the device structure 20. The dielectric structure 610 be or include an inter-layer dielectric (ILD) structure. The ILD structure may be formed of an oxide such as phospho-silicate glass (PSG), boro-silicate glass (BSG), boron-doped phospho-silicate glass (BPSG), tetra-ethyl-ortho-silicate (TEOS) oxide, or the like.

The support die 70 may be stacked under the device structure 50. The support die 70 may be a dummy die electrically disconnected or isolated from components external to the support die 70. The support die 70 is configured to provide support for the device structure 50 stacked over the support die 70 and the device structure 20.

In some embodiments, the support die 70 includes a body portion 710 and a bonding layer 720. The body portion 710 may include a semiconductor substrate including Si, Ge, SiGe, SiC, or other proper semiconductor materials. The body portion 710 may be a bulk substrate or constructed as an SOI substrate. The bonding layer 720 may include a hybrid bond layer or a fusion bond layer. In some embodiments, the bonding layer 720 includes an oxide based layer. In some embodiments, the bonding layer 720 has an oxide based bonding surface. In some embodiments, the bonding layer 720 includes silicon oxide, silicon oxynitride, or any suitable materials configured for hybrid bonding or fusion bonding. In some embodiments, the bonding layer 720 is bonded to the bonding layer 420. In some embodiments, the bonding layer 720 is fusion-bonded to the bonding layer 420. In some embodiments, the bonding layer 720 includes one or more of the auxiliary bond pads 30B bonded to an oxide based bonding surface of the bonding layer 420. In some embodiments, the auxiliary bond pads 30B are exposed from a bonding surface of the bonding layer 720. In some embodiments, the auxiliary bond pads 30B may be spaced apart from the body portion 710 by a portion of the bonding layer 720. In some embodiments, the dielectric structure 610 covers the support die 70. According to some embodiments of the present disclosure, the auxiliary bond pads 30B are advantageous to enhancing the bonding strength between the bonding layer 720 and the bonding layer 420.

The bonding layer 430 may include a hybrid bond layer or a fusion bond layer. In some embodiments, the bonding layer 430 has an oxide based bonding surface. In some embodiments, the bonding layer 430 includes silicon oxide, silicon oxynitride, or any suitable materials configured for hybrid bonding or fusion bonding. In some embodiments, the bonding layer 430 is bonded to the bonding layer 520. In some embodiments, the bonding layer 430 is fusion-bonded to the bonding layer 520. In some embodiments, an oxide based bonding surface of the bonding layer 430 is bonded to the auxiliary bond pads 30A in the bonding layer 520. The alignment mark 92 may be in the bonding layer 430. The alignment mark 92 may be free from overlapping the device structure 50 from a top view perspective (i.e., along the Z-axis).

The dielectric structure 620 may be between the bonding layer 430 and the bonding layer 420. In some embodiments, the dielectric structure 620 covers the device structure 50. The dielectric structure 620 be or include an ILD structure. The ILD structure may be formed of an oxide such as PSG, BSG, BPSG, TEOS oxide, or the like.

The conductive via 86 may electrically connect the device structure 50 to the electrical contact 88. In some embodiments, the conductive via 86 electrically connects the RDL structure 540 to the electrical contact 88. In some embodiments, the conductive via 86 penetrates the bonding layers 430, 520 and 590, the ESL, the gap-filling dielectric layer 570, and the passivation layer 560 to electrically connect to the RDL structure 540. In some embodiments, the conductive via 86 is electrically connected to a top patterned conductive layer 542 of the RDL structure 540. The conductive via 86 may include Cu, W, Co, Al, Ta, TaN, Ti, TiN, an alloy thereof, a combination thereof, or the like, or any other suitable conductive materials.

The electrical contact 88 may be or include a solder bump or a solder ball. The semiconductor structure 2 may include a plurality of electrical contacts 88. The electrical contacts 88 may be or include one or more conductive bumps, one or more solder balls, a ball grid array (BGA), one or more controlled collapse chip connection (C4) bumps, one or more micro bumps, or the like.

Figure 3:
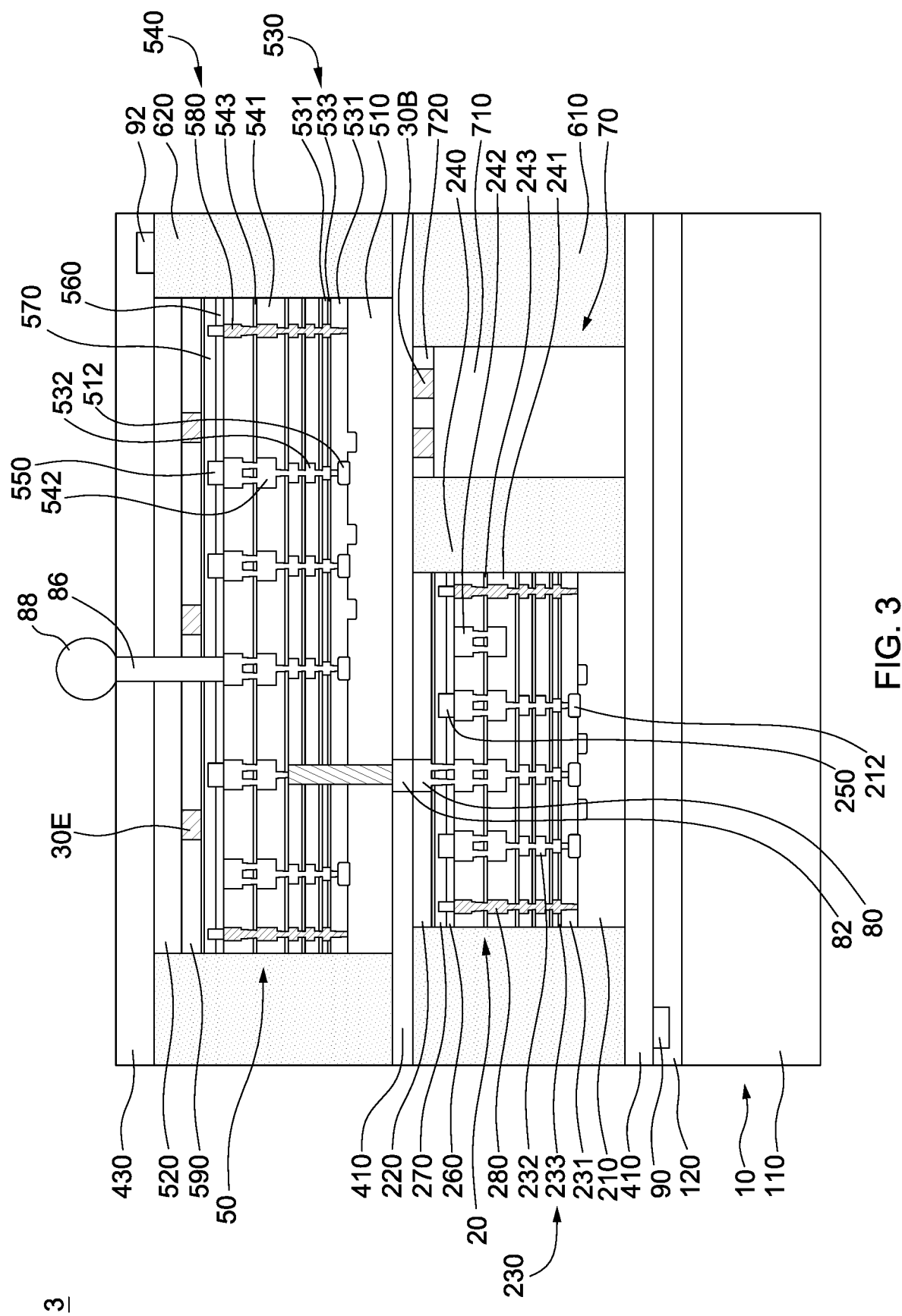
FIG. 3 is a cross-sectional view of a semiconductor structure in accordance with some embodiments of the present disclosure.

FIG. 3 is a cross-sectional view of a semiconductor structure 3 in accordance with some embodiments of the present disclosure. In some embodiments, the semiconductor structure 3 is similar to the semiconductor structure 2 in FIG. 2, with differences therebetween as follows. Descriptions of similar components are omitted.

Referring to FIG. 3, the semiconductor structure 3 may include auxiliary bond pads 30B and 30E.

In some embodiments, the bonding layer 590 of the device structure 50 includes one or more of the auxiliary bond pads 30E bonded to an oxide based bonding surface of the bonding layer 520. In some embodiments, the bonding layer 520 may be free of auxiliary bond pads.

Figure 4:
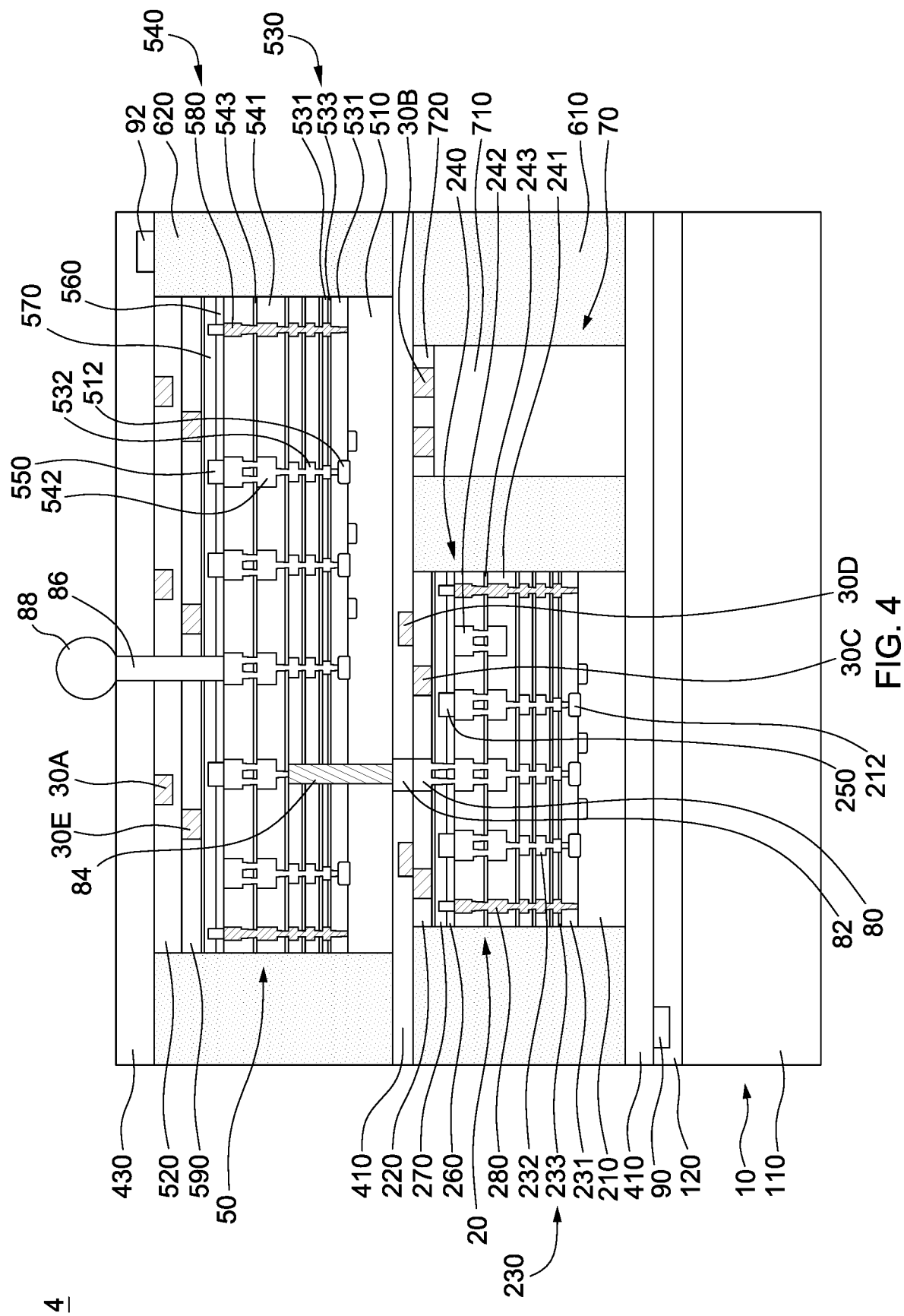
FIG. 4 is a cross-sectional view of a semiconductor structure in accordance with some embodiments of the present disclosure.

FIG. 4 is a cross-sectional view of a semiconductor structure 4 in accordance with some embodiments of the present disclosure. In some embodiments, the semiconductor structure 4 is similar to the semiconductor structure 2 in FIG. 2, with differences therebetween as follows. Descriptions of similar components are omitted.

Referring to FIG. 4, the semiconductor structure 4 may include auxiliary bond pads 30A, 30B, 30C, 30D, and 30E.

In some embodiments, the bonding layer 220 of the device structure 20 includes one or more of the auxiliary bond pads 30C bonded to an oxide based bonding surface of the bonding layer 410.

In some embodiments, the bonding layer 410 includes one or more of the auxiliary bond pads 30D bonded to an oxide based bonding surface of the bonding layer 220 of the device structure 20.

Figure 5:
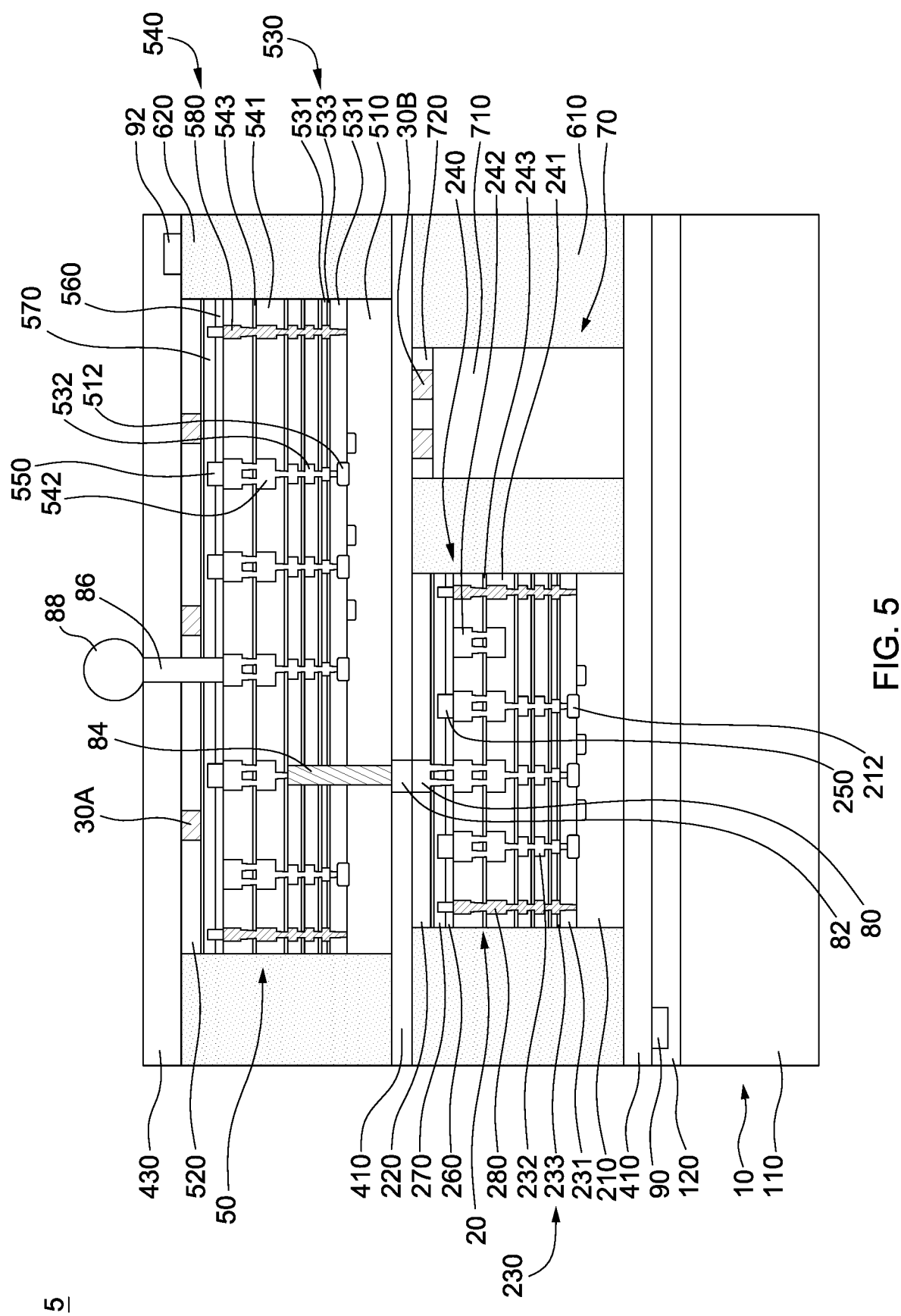
FIG. 5 is a cross-sectional view of a semiconductor structure in accordance with some embodiments of the present disclosure.

FIG. 5 is a cross-sectional view of a semiconductor structure 5 in accordance with some embodiments of the present disclosure. In some embodiments, the semiconductor structure 5 is similar to the semiconductor structure 2 in FIG. 2, with differences therebetween as follows. Descriptions of similar components are omitted.

Referring to FIG. 5, the semiconductor structure 5 may include auxiliary bond pads 30A and 30B. In some embodiments, the bonding layer 520 includes one or more of the auxiliary bond pads 30A bonded to an oxide based bonding surface of the bonding layer 430. The semiconductor structure 5 may be free of a bonding layer between the bonding layer 520 and the gap-filling dielectric layer 570. In some embodiments, the bonding layer 520 directly contacts the ESL of the device structure 50.

Figure 6:
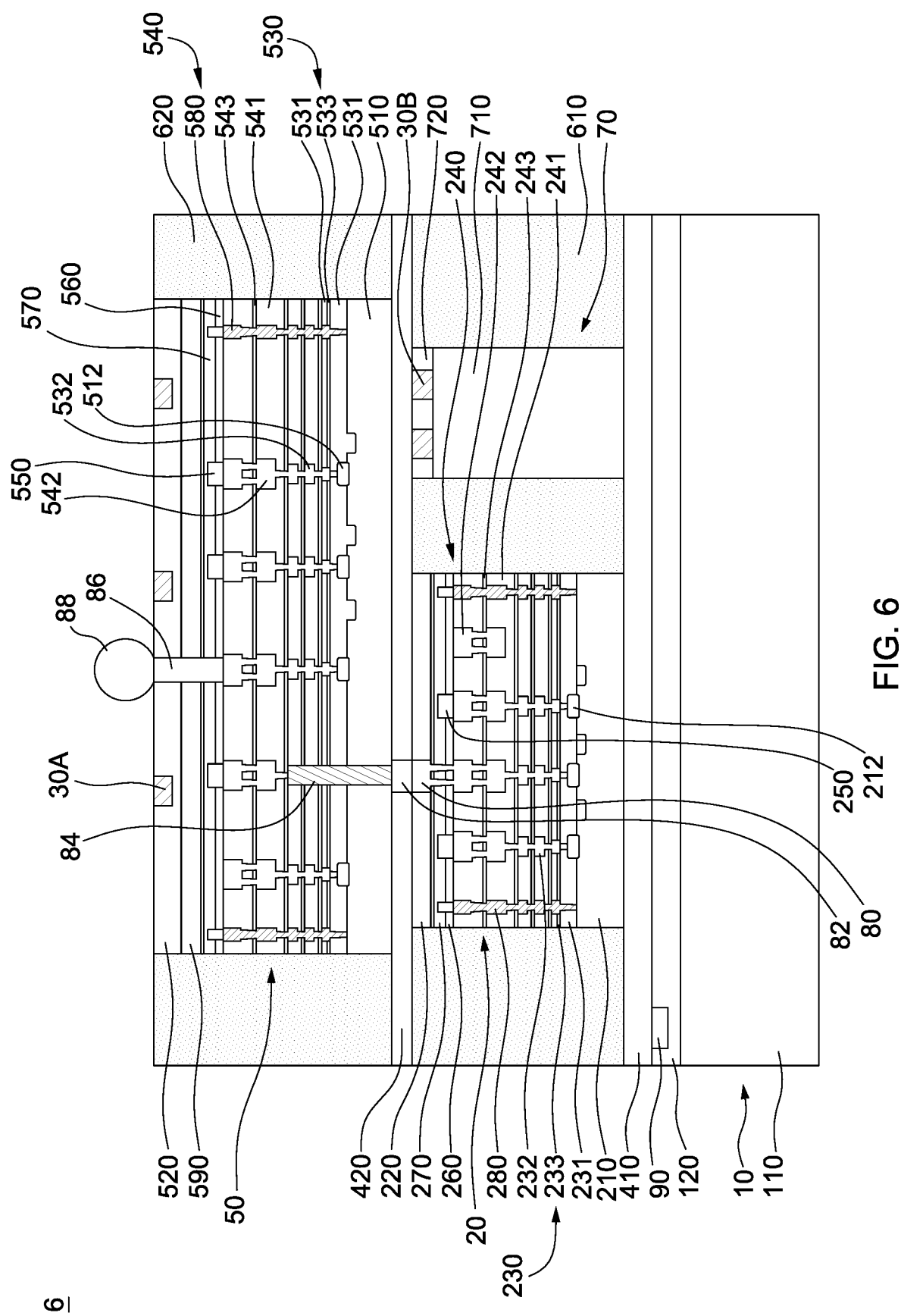
FIG. 6 is a cross-sectional view of a semiconductor structure in accordance with some embodiments of the present disclosure.

FIG. 6 is a cross-sectional view of a semiconductor structure 6 in accordance with some embodiments of the present disclosure. In some embodiments, the semiconductor structure 6 is similar to the semiconductor structure 2 in FIG. 2, with differences therebetween as follows. Descriptions of similar components are omitted.

Referring to FIG. 6, the semiconductor structure 6 may include auxiliary bond pads 30A and 30B. In some embodiments, the bonding layer 520 includes one or more of the auxiliary bond pads 30A exposed by an upper surface of the bonding layer 520. The semiconductor structure 6 may be free of a bonding layer over the bonding layer 520.

Figure 7A:
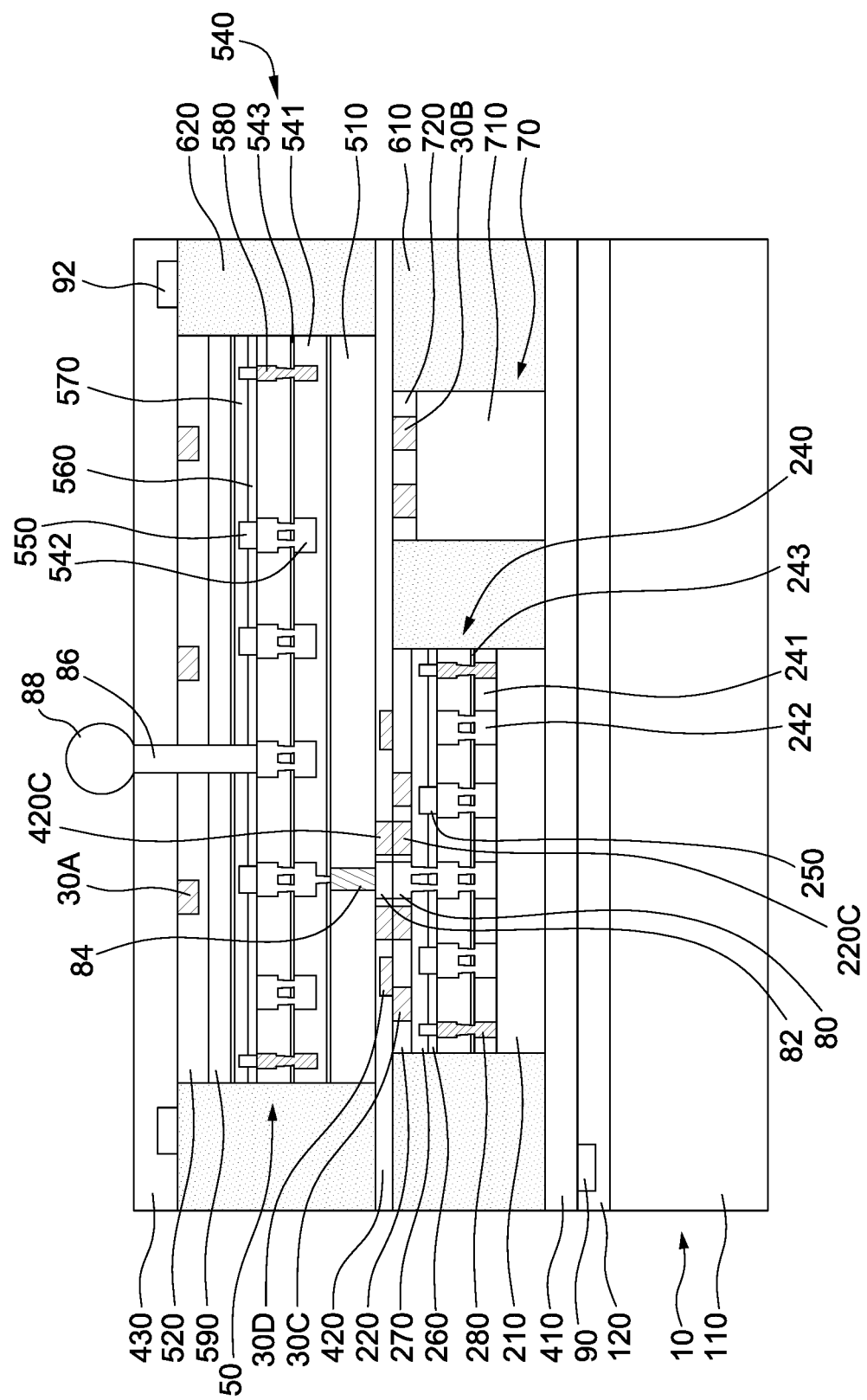
FIG. 7A is a cross-sectional view of a semiconductor structure in accordance with some embodiments of the present disclosure.

FIG. 7A is a cross-sectional view of a semiconductor structure 7A in accordance with some embodiments of the present disclosure. In some embodiments, the semiconductor structure 7A is similar to the semiconductor structure 2 in FIG. 2, with differences therebetween as follows. Descriptions of similar components are omitted.

Referring to FIG. 7A, the semiconductor structure 7A may include auxiliary bond pads 30A, 30B, 30C, and 30D. In some embodiments, the device structure 20 includes a semiconductor substrate 210, a bonding layer 220, an RDL structure 240, conductive pads 250, a passivation layer 260, a gap-filling dielectric layer 270, and a seal ring 280. In some embodiments, the bonding layer 220 includes hybrid bond pads 220C. The hybrid bond pads 220C are exposed from an upper surface (e.g., the oxide based bonding surface) of the bonding layer 220. The hybrid bond pads 220C may be electrically connected to the RDL structure 240 of the device structure 20. In some embodiments, the device structure 50 includes a semiconductor substrate 510, bonding layers 520 and 590, an RDL structure 540, conductive pads 550, a passivation layer 560, a gap-filling dielectric layer 570, and a seal ring 580. In some embodiments, the bonding layer 420 includes hybrid bond pads 420C. The hybrid bond pads 420C are exposed from a surface (e.g., the oxide based bonding surface) of the bonding layer 420. The hybrid bond pads 420C may be electrically connected to the device structure 50.

In some embodiments, the bonding layer 220 is hybrid-bonded to the bonding layer 420. In some embodiments, the hybrid bond pads 220C are bonded to the hybrid bond pads 420C. In some embodiments, each of the hybrid bond pads 220C is substantially aligned to a corresponding one of the hybrid bond pads 420C. In some embodiments, the auxiliary bond pad 30C is spaced apart from the auxiliary bond pad 30D. In some embodiments, the auxiliary bond pad 30C is misaligned with or offset from the auxiliary bond pad 30D. In some embodiments, the auxiliary bond pad 30C contacts a portion of the auxiliary bond pad 30D.

Figure 7B:
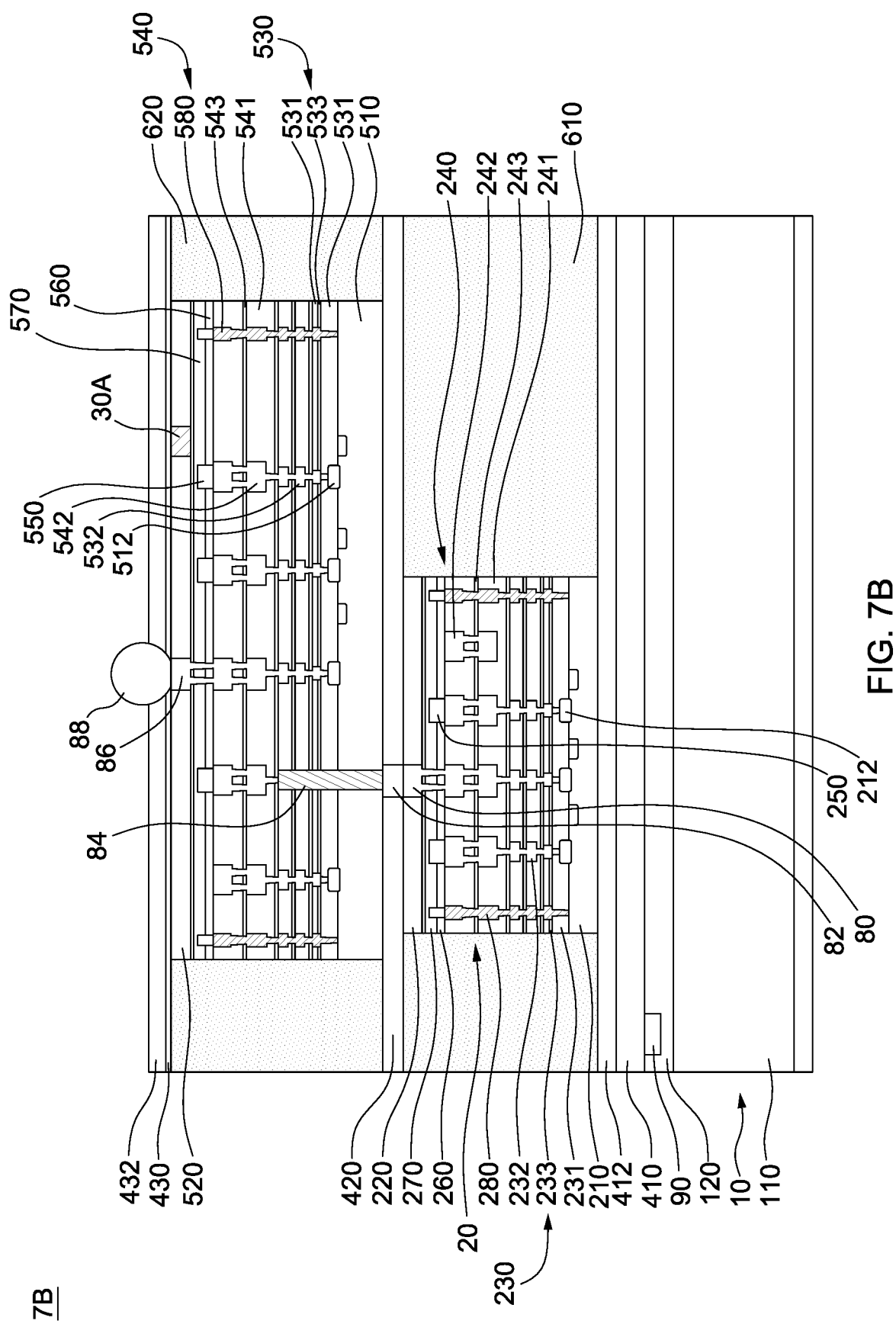
FIG. 7B is a cross-sectional view of a semiconductor structure in accordance with some embodiments of the present disclosure.

FIG. 7B is a cross-sectional view of a semiconductor structure 7B in accordance with some embodiments of the present disclosure. In some embodiments, the semiconductor structure 7B is similar to the semiconductor structure 2 in FIG. 2, with differences therebetween as follows. Descriptions of similar components are omitted.

Referring to FIG. 7B, the semiconductor structure 7B may include auxiliary bond pads 30A. In some embodiments, the semiconductor structure 7B includes bonding layers 410, 412, 430, and 432. In some embodiments, semiconductor structure 7B is free of a support die between the bonding layer 412 and the bonding layer 420.

Figure 8C:
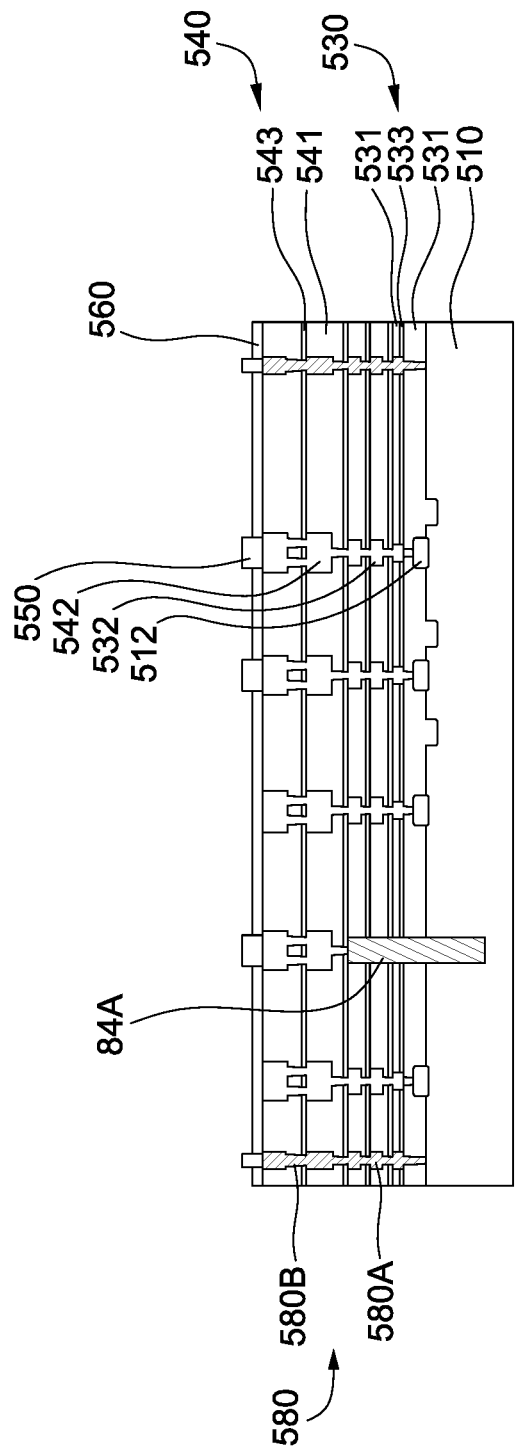
FIGS. 8A to 8N are cross-sectional views of intermediate stages of a method of manufacturing a semiconductor structure in accordance with some embodiments of the present disclosure.
Figure 8D:
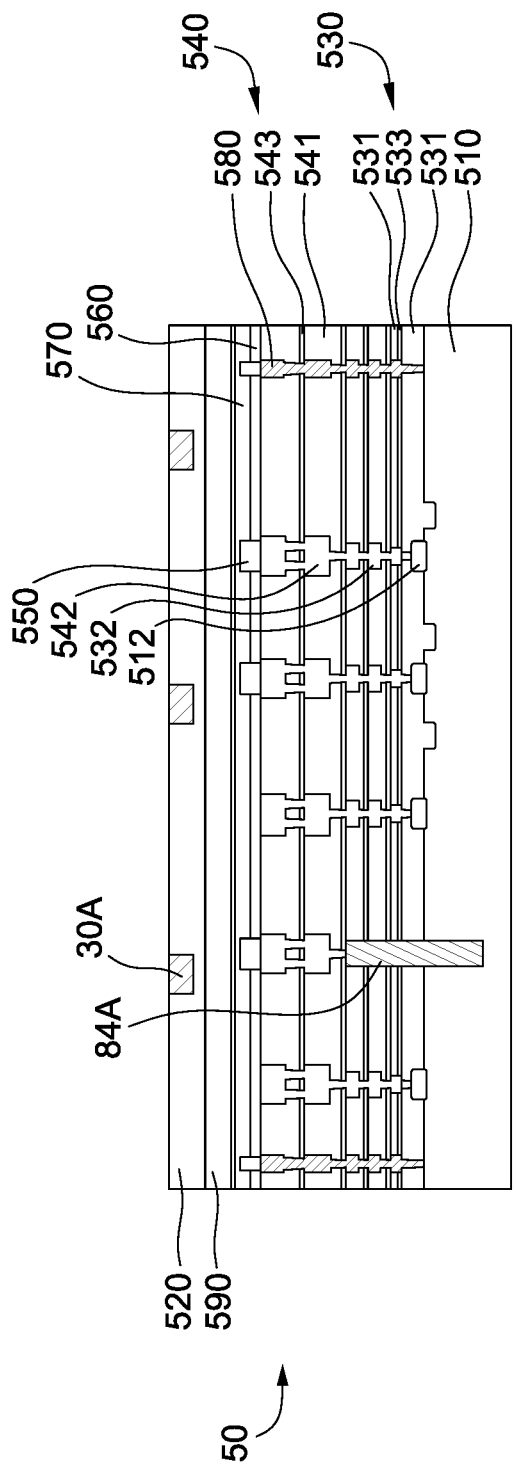
Figure 8G:
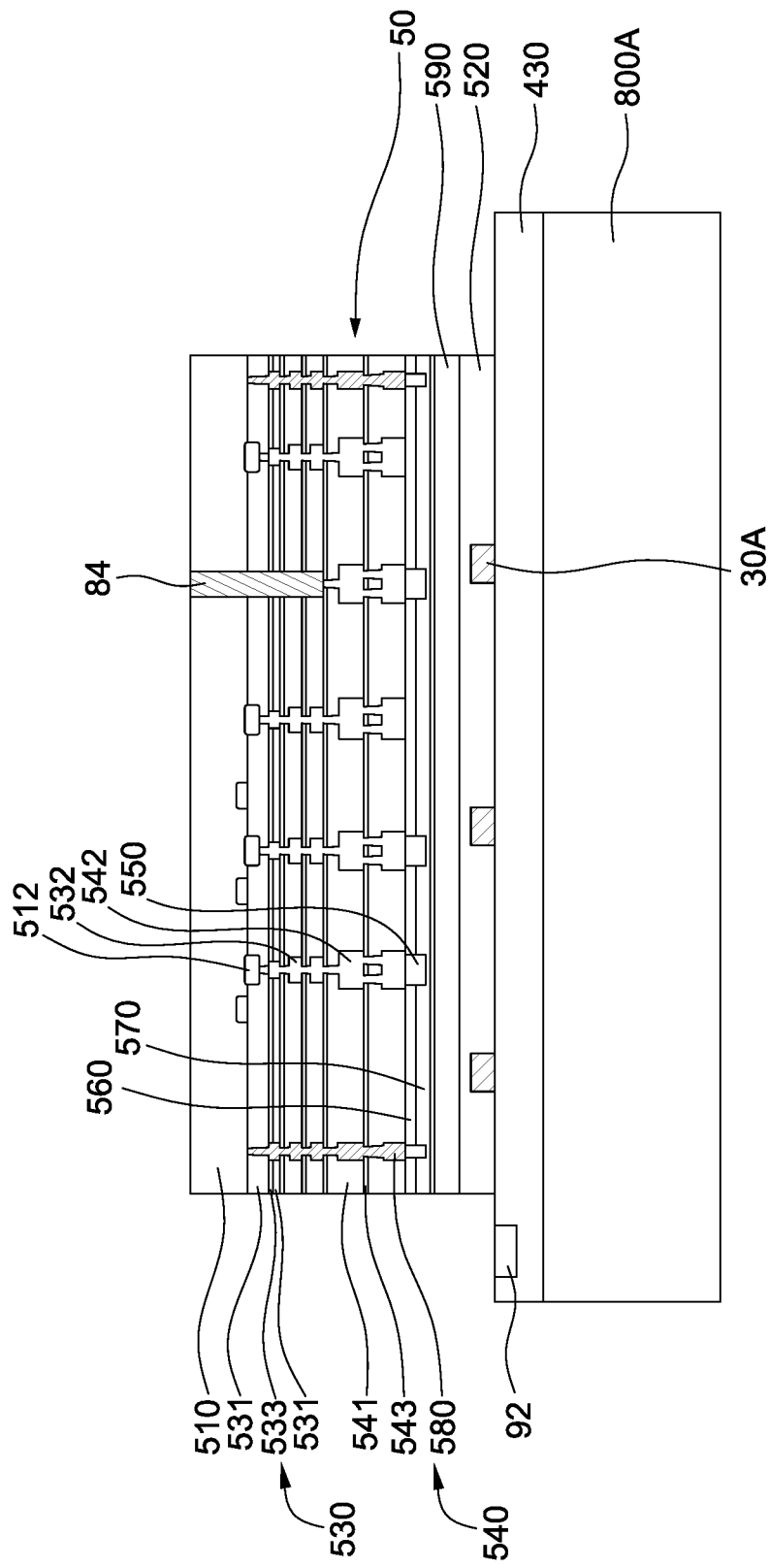
Figure 8H:
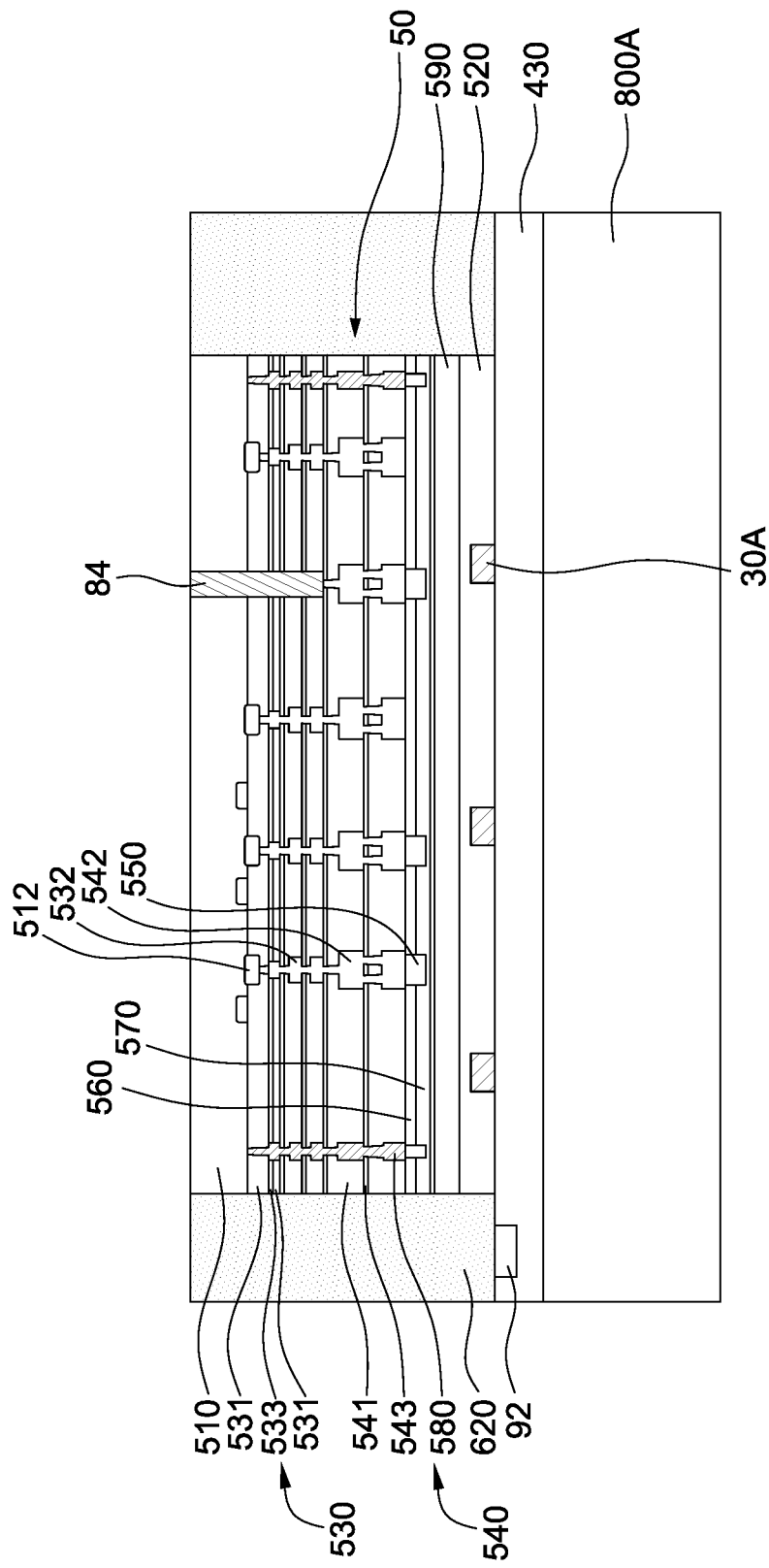
Figure 8I:
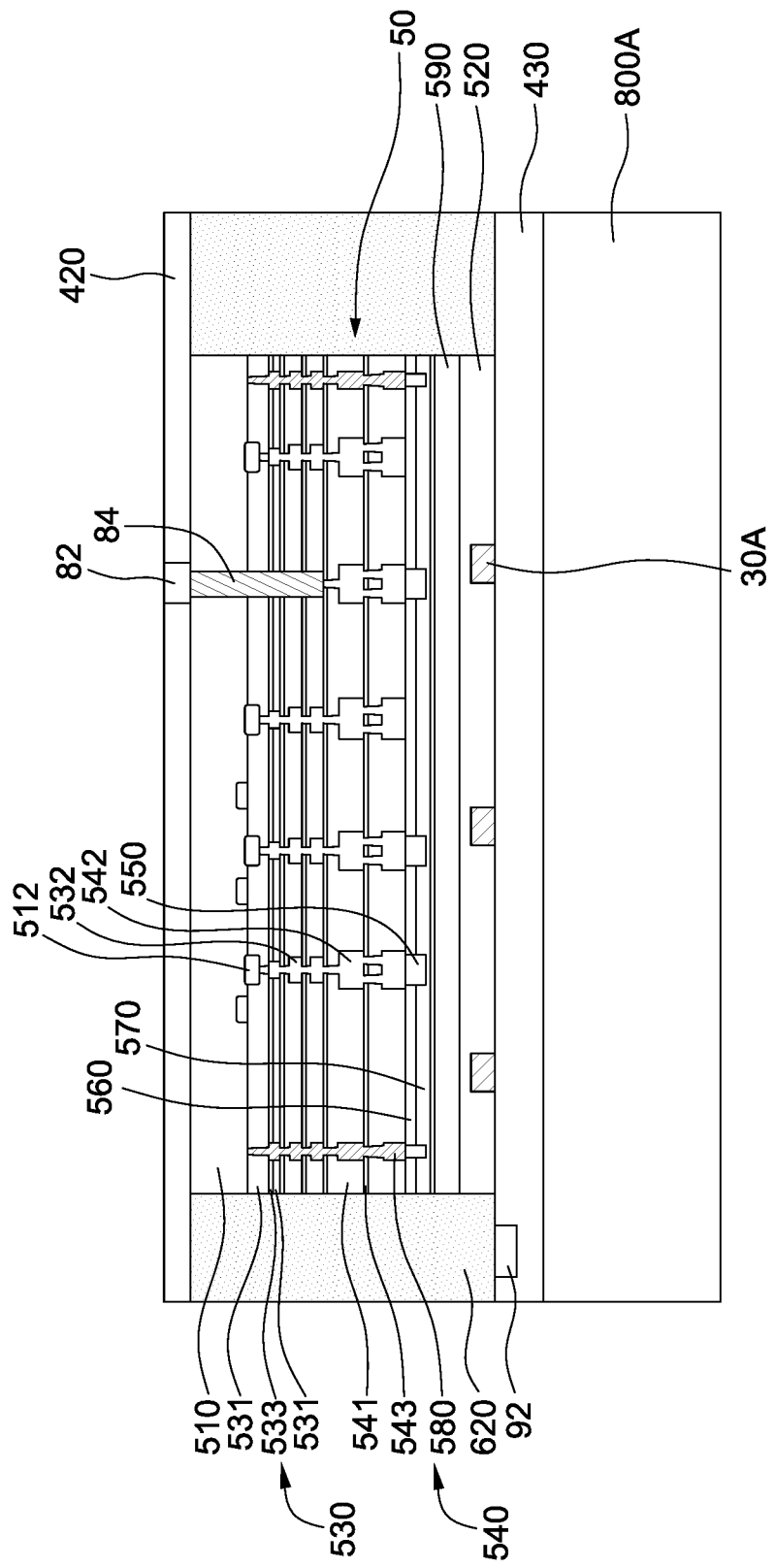
Figure 8J:
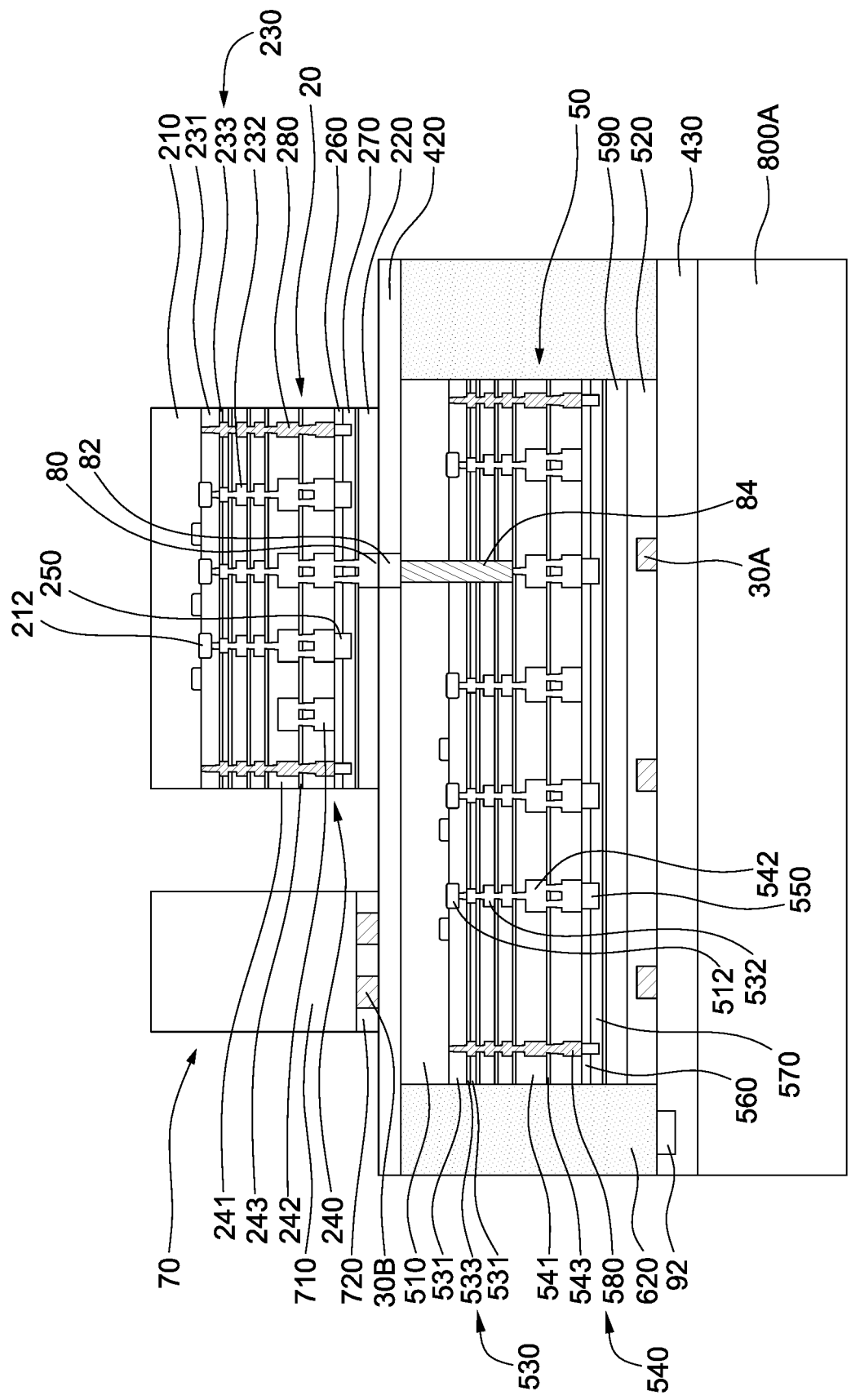
Figure 8K:
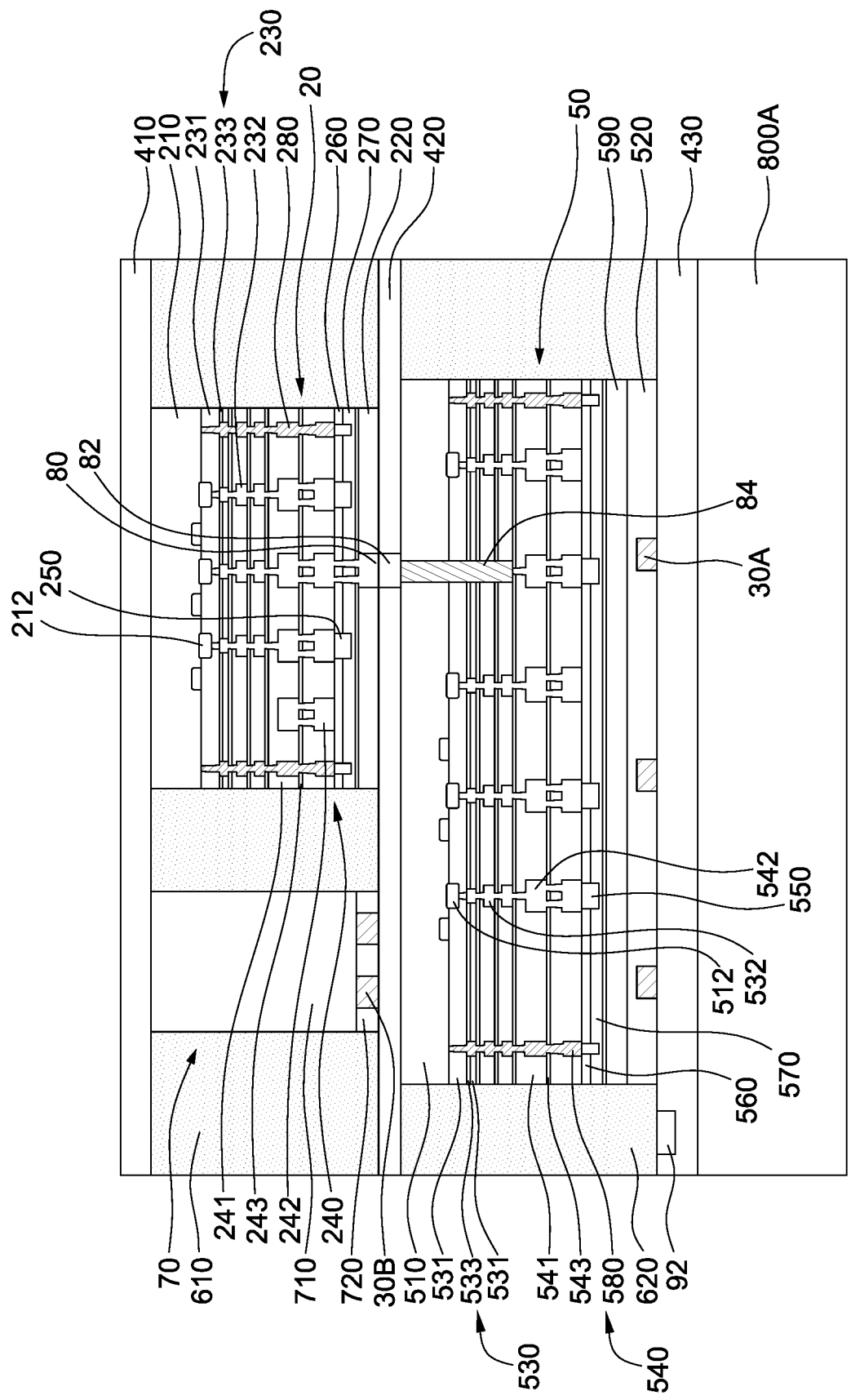
Figure 8L:
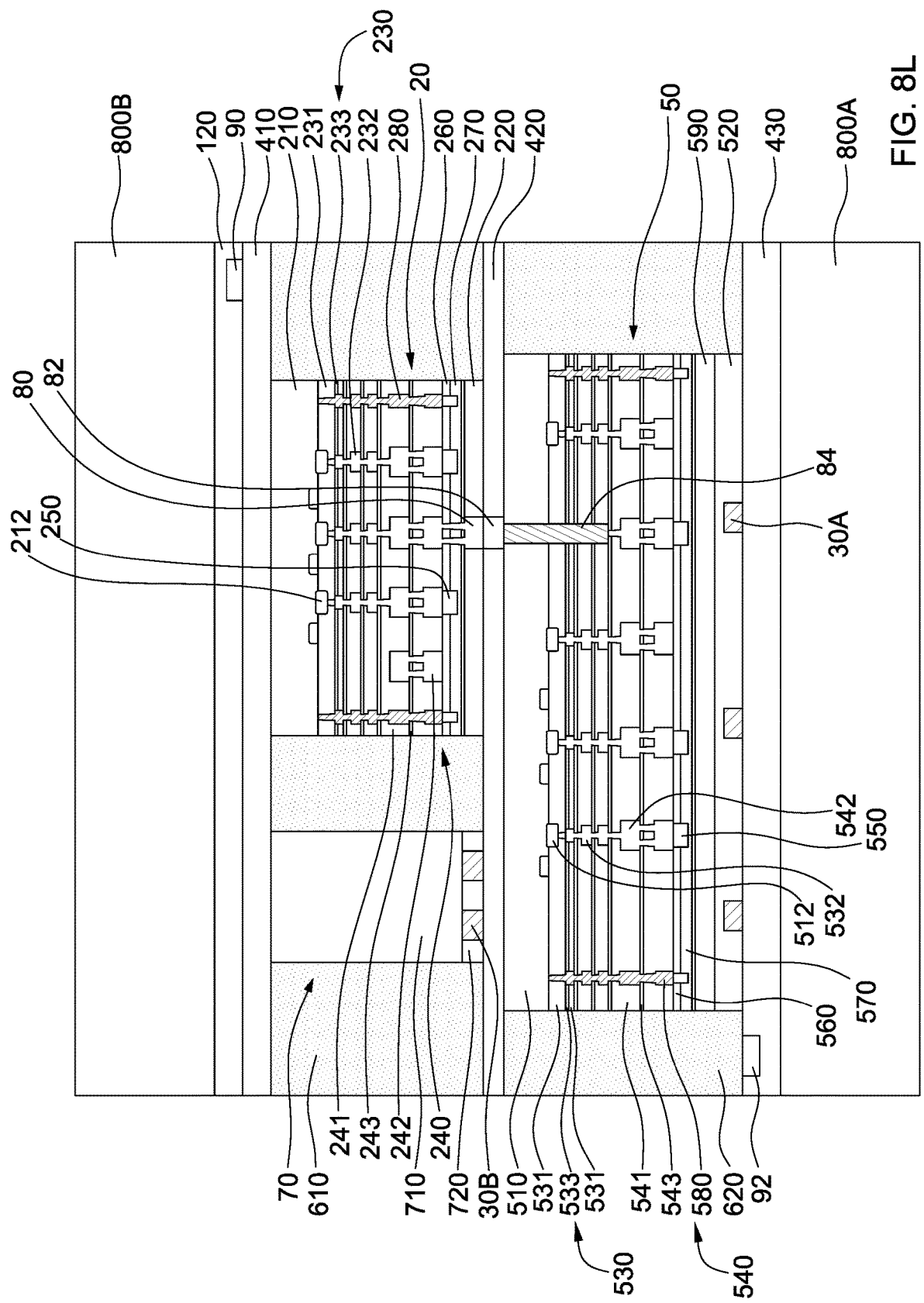
Figure 8M:
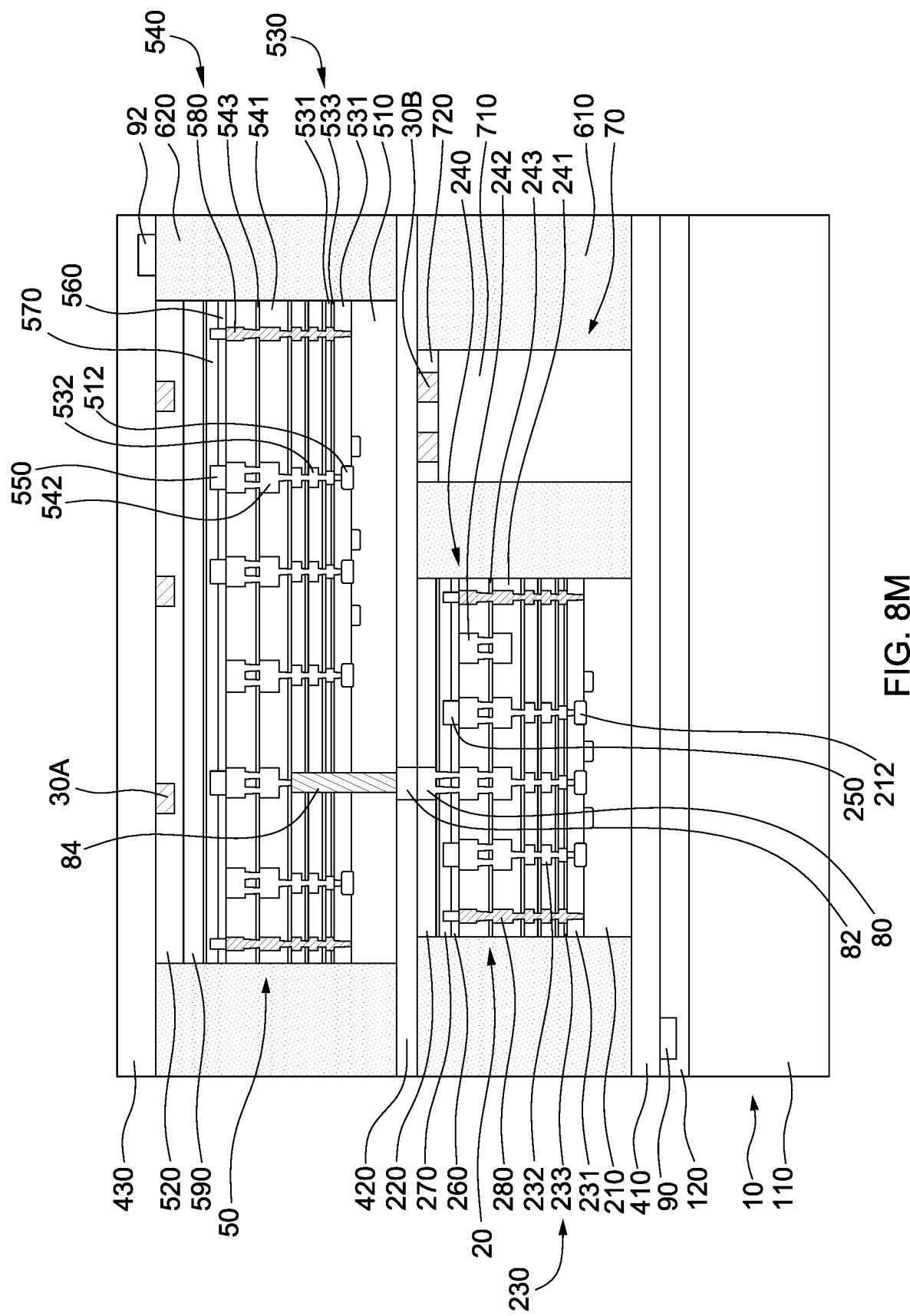
Figure 8N:
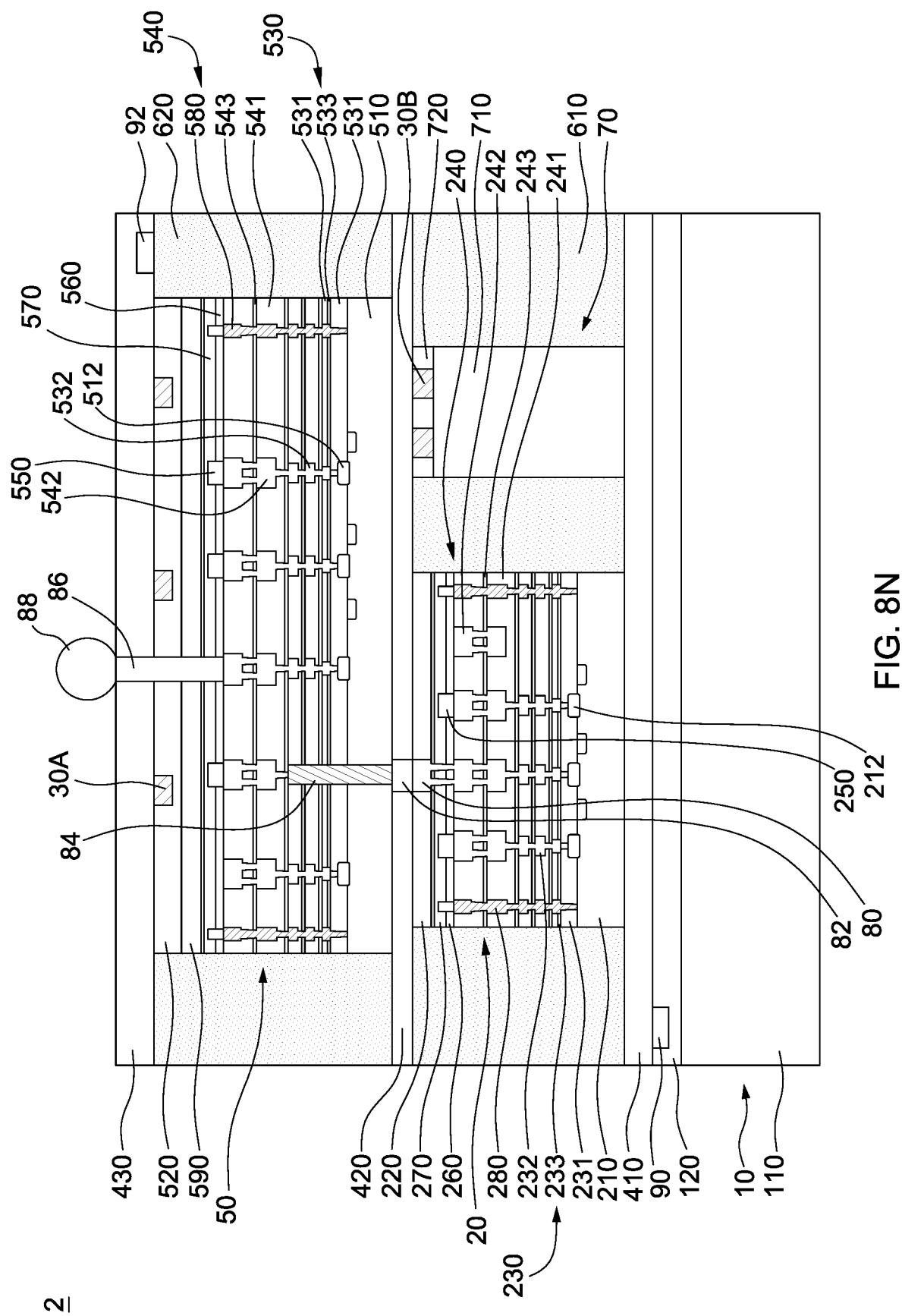

FIGS. 8A to 8N are cross-sectional views of intermediate stages of a method of manufacturing a semiconductor structure 2 in accordance with some embodiments of the present disclosure.

Referring to FIG. 8A, a semiconductor substrate 510 may be provided. The semiconductor substrate 510 may serve as a carrier for the following layers/components to be formed or disposed thereon. The semiconductor substrate 510 may include one or more devices 512 adjacent to an upper surface of the semiconductor substrate 510. The devices 512 may include integrated circuit devices such as transistors, diodes, resistors, capacitors, and/or the like.

Referring to FIG. 8B, an interconnection structure 530 may be formed on the semiconductor substrate 510, and a conductive via 84A may be formed penetrating the interconnection structure 530 to extend into a portion of the semiconductor substrate 510. In some embodiments, the interconnection structure 530 includes a plurality of dielectric layers 531, a plurality of patterned conductive layers 532, and a plurality of ESLs 533, and the patterned conductive layers 532 are electrically connected to the devices 512. In some embodiments, a seal ring portion 580A is formed penetrating the interconnection structure 530.

Referring to FIG. 8C, an RDL structure 540 may be formed on the interconnection structure 530, a passivation layer 560 may be formed on the RDL structure 540, and conductive pads 550 may be formed penetrating the passivation layer 560 to electrically connect to the RDL structure 540. In some embodiments, the RDL structure 540 includes a plurality of dielectric layers 541, a plurality of patterned conductive layers 542, and a plurality of ESLs 543. In some embodiments, the conductive pads 550 are formed on exposed portions of the top patterned conductive layer 542. In some embodiments, the patterned conductive layers 542 electrically connect to the top patterned conductive layer 532 and the conductive via 84A. In some embodiments, a seal ring portion 580B is formed penetrating the RDL structure 540 to connect to the seal ring portion 580A. The seal ring portions 580A and 580B form a seal ring 580.

Referring to FIG. 8D, a gap-filling dielectric layer 570 may be formed to cover the conductive pads 550, an ESL may be formed on the gap-filling dielectric layer 570, a bonding layer 590 may be formed on the gap-filling dielectric layer 570, a bonding layer 520 may be formed on the bonding layer 590, and auxiliary bond pads 30A may be formed within the bonding layer 520. The bonding layers 520 and 590 may include oxide based layers having oxide based bonding surfaces. The auxiliary bond pads 30A may be exposed by an upper surface (e.g., the oxide based bonding surface) of the oxide based layer. The auxiliary bond pads 30A may be or include dummy conductive pads. As such, a device structure 50 may be formed.

Referring to FIG. 8E, a semiconductor substrate 210 may be provided, an interconnection structure 230 may be formed on the semiconductor substrate 210, an RDL structure 240 may be formed on the interconnection structure 230, a passivation layer 260 may be formed on the RDL structure 240, and conductive pads 250 may be formed penetrating the passivation layer 260 to electrically connect to the RDL structure 240. In some embodiments, a seal ring 280 is formed penetrating the interconnection structure 230 and the RDL structure 240.

In some embodiments, the semiconductor substrate 210 may serve as a carrier for the following layers/components to be formed or disposed thereon. The semiconductor substrate 210 may include one or more devices 212 adjacent to an upper surface of the semiconductor substrate 210. The devices 212 may include integrated circuit devices such as transistors, diodes, resistors, capacitors, and/or the like. In some embodiments, the interconnection structure 230 includes a plurality of dielectric layers 231, a plurality of patterned conductive layers 232, and a plurality of ESLs 233, and the patterned conductive layers 232 are electrically connected to the devices 212. In some embodiments, the RDL structure 240 includes a plurality of dielectric layers 241, a plurality of patterned conductive layers 242, and a plurality of ESLs 243. In some embodiments, the conductive pads 250 are formed on exposed portions of the top patterned conductive layer 242. In some embodiments, the patterned conductive layers 242 electrically connect to the top patterned conductive layer 232.

Referring to FIG. 8F, a gap-filling dielectric layer 270 may be formed to cover the conductive pads 250, a bonding layer 220 may be formed on the gap-filling dielectric layer 270, and a conductive bump 80 may be formed within the bonding layer 220. The bonding layer 220 may include an oxide based layer having an oxide based bonding surface. The conductive bump 80 may be exposed by an upper surface (e.g., the oxide based bonding surface) of the oxide based layer. As such, a device structure 20 may be formed.

Referring to FIG. 8G, a carrier 800A may be provided, and the device structure 50 may be bonded to the carrier 800A. In some embodiments, a bonding layer 430 is formed on the carrier 800A. The bonding layer 430 may include an oxide based layer having an oxide based bonding surface. In some embodiments, the oxide based layer and the auxiliary bond pads 30A of the bonding layer 520 is bonded to the oxide based bonding surface of the bonding layer 430. In some embodiments, the bonding layer 520 is fusion-bonded to the bonding layer 430. An alignment mark 92 may be in the bonding layer 430 prior to bonding the device structure 50 to the carrier 800A. The alignment mark 92 may be free from overlapping the device structure 50 from a top view perspective (i.e., along the Z-axis).

In some embodiments, an auxiliary bond pad 30A is completely surrounded by dielectric material. For example, the auxiliary bond pad 30A may be completely surrounded by dielectric material of the bonding layer 520 and dielectric material of the bonding layer 430. In some embodiments, an auxiliary bond pad 30A is spaced completely from other conductive features (e.g., pads, wires, vias, etc.). In some embodiments, an auxiliary bond pad 30A is inset into one of the bonding layers 430, 520 and has a conductive surface facing the other one of the bonding layers 430, 520. In at least some of such embodiments, a majority or an entirety of the conductive surface directly contacts the other one of the bonding layers 430, 520 at an elevation level with a bond interface between the bonding layers 430, 520. The majority may, for example, be greater than 50%, 75%, 90%, or some other suitable percentage of a total surface area of the conductive surface of the auxiliary bond pad 30A.

In some embodiments, the bonding is performed using water and/or using hydrophilic fusion bonding, and the auxiliary bond pads 30A react with the water to reduce water trapped at the bond interface between the bonding layers 430, 520. In some embodiments, an insignificant amount of trapped water molecules remains at the bond interface between the bonding layers 430, 520. In other embodiments, trapped water molecules are completely eliminated from the bond interface between the bonding layers 430, 520. In some embodiments, unreacted silanol groups persist at the bond interface between the bonding layers 430, 520.

Referring to FIG. 8H, a dielectric structure 620 may be formed to cover the bonding layer 430 and the device structure 50, and the semiconductor substrate 510 may be thinned to expose the conductive via 84. In some embodiments, a chemical mechanical planarization (CMP) process may be performed to remove portions of the semiconductor substrate 510, the dielectric structure 620, and the conductive via 84A to expose a portion of the conductive via 84 from a surface of the semiconductor substrate 510.

Referring to FIG. 8I, a bonding layer 420 may be formed on the semiconductor substrate 510 and the dielectric structure 620, and a conductive bump 82 may be formed to penetrate the bonding layer 420 to connect to the conductive via 84. The bonding layer 420 may include an oxide based layer having an oxide based bonding surface. The conductive bump 82 may be exposed by an upper surface (e.g., the oxide based bonding surface) of the oxide based layer.

Referring to FIG. 8J, a support die 70 and the device structure 20 may be bonded to the device structure 50. In some embodiments, the bonding layer 220 of the device structure 20 is bonded to the bonding layer 420. In some embodiments, the bonding layer 220 of the device structure 20 is fusion-bonded to the bonding layer 420. In some embodiments, the conductive bump 80 is bonded to the conductive bump 82.

In some embodiments, the support die 70 includes a body portion 710 and a bonding layer 720. The body portion 710 may include a semiconductor substrate including Si, Ge, SiGe, SiC, or other proper semiconductor materials. The body portion 710 may be a bulk substrate or constructed as an SOI substrate. The bonding layer 720 may include an oxide based layer having an oxide based bonding surface. Auxiliary bond pads 30B may be formed within the bonding layer 720. The auxiliary bond pads 30B may be exposed by a surface (e.g., the oxide based bonding surface) of the oxide based layer. The auxiliary bond pads 30B may be or include dummy conductive pads. In some embodiments, the oxide based layer and the auxiliary bond pads 30B of the bonding layer 720 are bonded to the oxide based bonding surface of the bonding layer 420. In some embodiments, the bonding layer 720 is fusion-bonded to the bonding layer 420. In some embodiments, the oxide based layer of the bonding layer 720 is fusion-bonded to the oxide based bonding surface of the bonding layer 420.

In some embodiments, an auxiliary bond pad 30B is completely surrounded by dielectric material. For example, the auxiliary bond pad 30B may be completely surrounded by dielectric material, which includes dielectric material of the bonding layer 720 and dielectric material of the bonding layer 420. In some embodiments, an auxiliary bond pad 30B is spaced completely from other conductive features (e.g., pads, wires, vias, etc.). In some embodiments, an auxiliary bond pad 30B is inset into one of the bonding layers 420, 720 and has a conductive surface facing the other one of the bonding layers 420, 720. In at least some of such embodiments, a majority or an entirety of the conductive surface directly contacts the other one of the bonding layers 420, 720 at an elevation level with a bond interface between the bonding layers 420, 720. The majority may, for example, be greater than 50%, 75%, 90%, or some other suitable percentage of a total surface area of the conductive surface of the auxiliary bond pad 30B.

In some embodiments, the bonding is performed using water and/or using hydrophilic fusion bonding, and the auxiliary bond pads 30B react with the water to reduce water trapped at the bond interface between the bonding layers 420, 720. In some embodiments, an insignificant amount of trapped water molecules remains at the bond interface between the bonding layers 420, 720. In other embodiments, trapped water molecules are completely eliminated from the bond interface between the bonding layers 420, 720. In some embodiments, a first amount of trapped water molecules remains at the bond interface between the bonding layers 220, 420, and a second amount of trapped water molecules less than the first amount remains at the bond interface between the bonding layers 420, 720 because of the auxiliary bond pads 30B. In some embodiments, unreacted silanol groups persist at the bond interface between the bonding layers 420, 720.

Referring to FIG. 8K, a dielectric structure 610 may be formed to cover the bonding layer 420, the device structure 20, and the support die 70, and a bonding layer 410 may be formed on the dielectric structure 610, the device structure 20, and the support die 70. The bonding layer 410 may include an oxide based layer having an oxide based bonding surface.

Referring to FIG. 8L, a bonding layer 120 may be formed or disposed on the bonding layer 410, and a carrier 800B may be formed or disposed on the bonding layer 120. The bonding layer 120 may include an oxide based layer having an oxide based bonding surface. In some embodiments, the oxide based layer of the bonding layer 120 is fusion-bonded to the oxide based bonding surface of the bonding layer 410. The carrier 800B may be a semiconductor substrate (e.g., the semiconductor substrate 110 illustrated in FIG. 2).

Referring to FIG. 8M, the structure illustrated in FIG. 8L may be flipped-over, and the carrier 800A may be removed. In some embodiments, the carrier 800A is removed by a CMP process to expose the bonding layer 430.

Referring to FIG. 8N, a conductive via 86 may be formed to electrically connect to the device structure 50, and an electrical contact 88 may be formed to electrically connect to the conductive via 86. In some embodiments, the conductive via 86 is formed penetrating the bonding layers 430, 520 and 590, the ESL, the gap-filling dielectric layer 570, and the passivation layer 560 to electrically connect to the RDL structure 540. As such, the semiconductor structure 2 is formed.

Figure 9A:
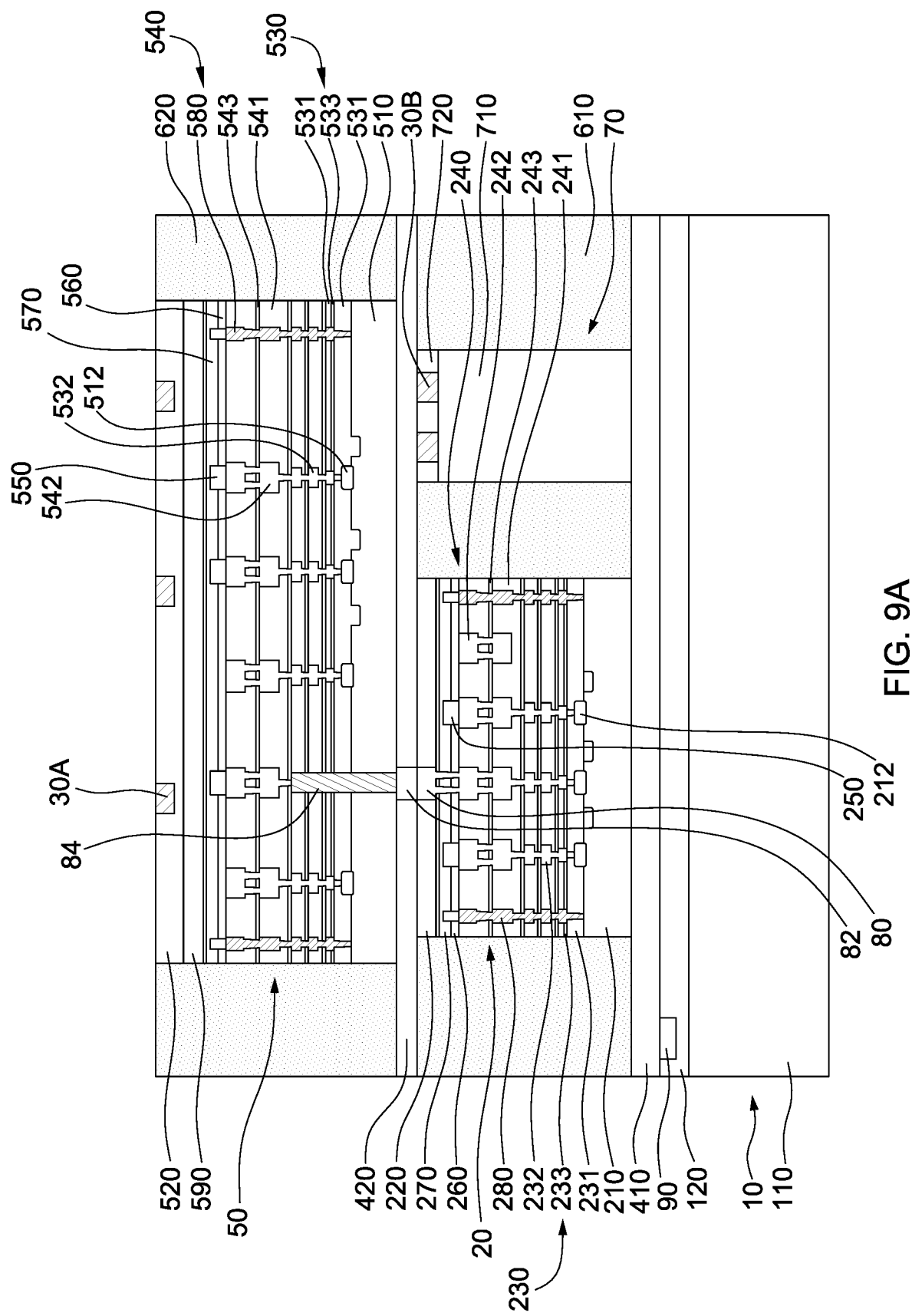

FIGS. 9A to 9B are cross-sectional views of intermediate stages of a method of manufacturing a semiconductor structure 6 in accordance with some embodiments of the present disclosure.

Operations similar to those illustrated in FIGS. 8A to 8L may be performed to form a structure illustrated in FIG. 8L. Further, referring to FIG. 9A, the structure illustrated in FIG. 8L may be flipped-over, and the carrier 800A and the bonding layer 430 may be removed. In some embodiments, the carrier 800A and the bonding layer 430 are removed by a CMP process to expose the bonding layer 520.

Referring to FIG. 9B, a conductive via 86 may be formed to electrically connect to the device structure 50, and an electrical contact 88 may be formed to electrically connect to the conductive via 86. In some embodiments, the conductive via 86 is formed penetrating the bonding layers 520 and 590, the ESL, the gap-filling dielectric layer 570, and the passivation layer 560 to electrically connect to the RDL structure 540. As such, the semiconductor structure 6 is formed.

FIGS. 10A to 10I are cross-sectional views of intermediate stages of a method of manufacturing a semiconductor structure 7A in accordance with some embodiments of the present disclosure.

Figure 10A:
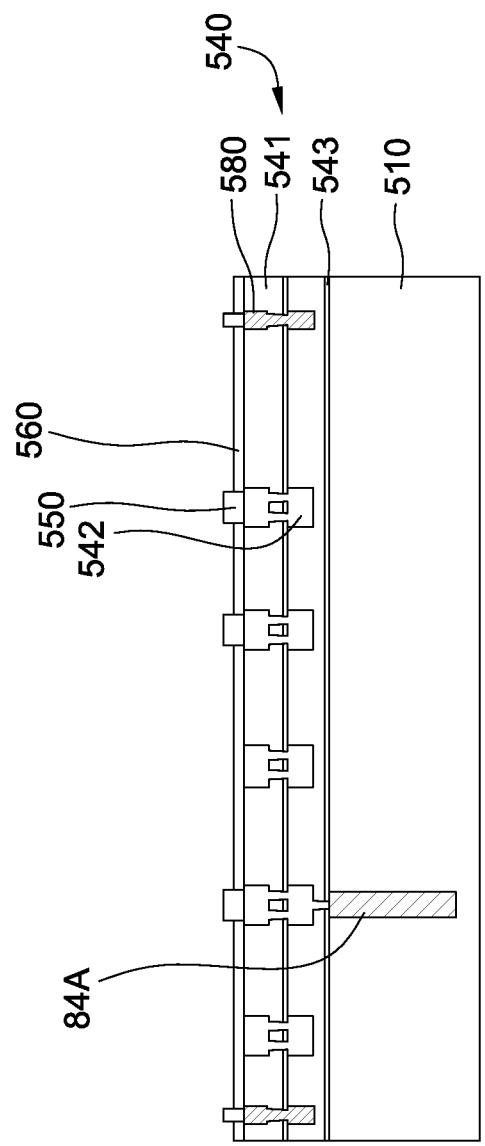
FIGS. 10A to 10I are cross-sectional views of intermediate stages of a method of manufacturing a semiconductor structure in accordance with some embodiments of the present disclosure.

Referring to FIG. 10A, a semiconductor substrate 510 may be provided, an RDL structure 540 may be formed on the semiconductor substrate 510, a passivation layer 560 may be formed on the RDL structure 540, and a conductive via 84A may be formed penetrating the RDL structure 540 to extend into a portion of the semiconductor substrate 510, and conductive pads 550 may be formed penetrating the passivation layer 560 to electrically connect to the RDL structure 540. In some embodiments, the RDL structure 540 includes a plurality of dielectric layers 541, a plurality of patterned conductive layers 542, and a plurality of ESLs 543. In some embodiments, the patterned conductive layers 542 electrically connect to the conductive via 84A. In some embodiments, a seal ring 580 is formed penetrating the RDL structure 540.

Figure 10B:
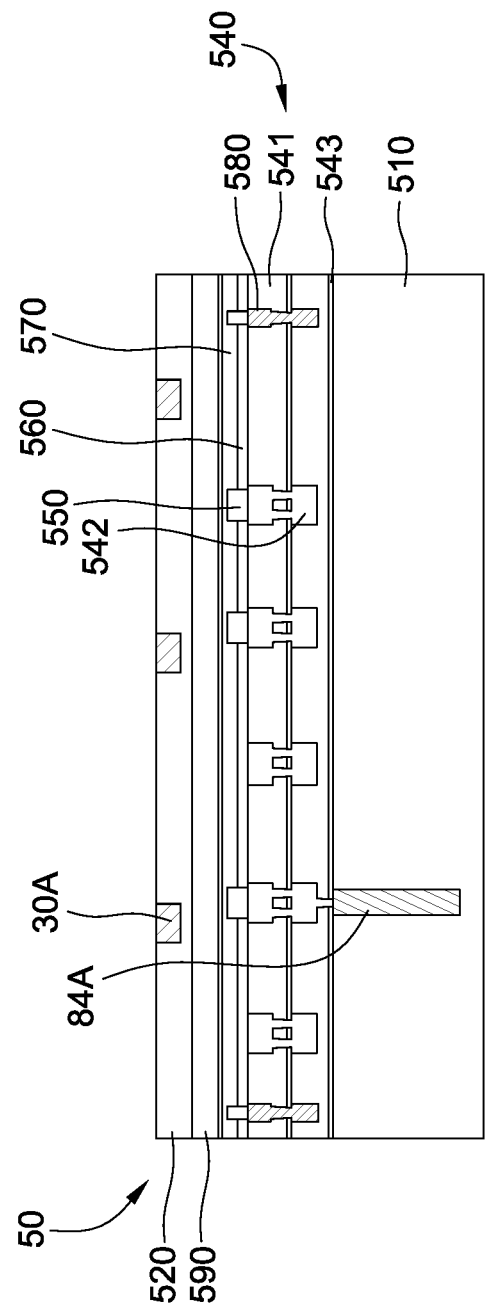

Referring to FIG. 10B, a gap-filling dielectric layer 570 may be formed to cover the conductive pads 550, a CESL may be formed on the gap-filling dielectric layer 570, a bonding layer 590 may be formed on the gap-filling dielectric layer 570, a bonding layer 520 may be formed on the bonding layer 590, and auxiliary bond pads 30A may be formed within the bonding layer 520. The bonding layers 520 and 590 may include oxide based layers having oxide based bonding surfaces. The auxiliary bond pads 30A may be exposed by an upper surface (e.g., the oxide based bonding surface) of the oxide based layer. The auxiliary bond pads 30A may be or include dummy conductive pads. As such, a device structure 50 may be formed.

Figure 10C:
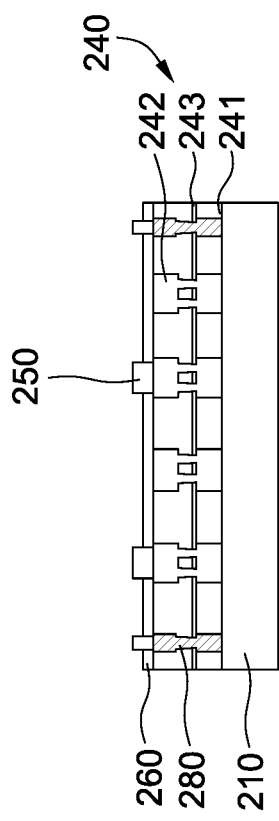

Referring to FIG. 10C, a semiconductor substrate 210 may be provided, an RDL structure 240 may be formed on the semiconductor substrate 210, a passivation layer 260 may be formed on the RDL structure 240, and conductive pads 250 may be formed penetrating the passivation layer 260 to electrically connect to the RDL structure 240. In some embodiments, a seal ring 280 is formed penetrating the RDL structure 240.

In some embodiments, the semiconductor substrate 210 may serve as a carrier for the following layers/components to be formed or disposed thereon. In some embodiments, the RDL structure 240 includes a plurality of dielectric layers 241, a plurality of patterned conductive layers 242, and a plurality of ESLs 243. In some embodiments, the conductive pads 250 are formed on exposed portions of the top patterned conductive layer 242.

Figure 10D:
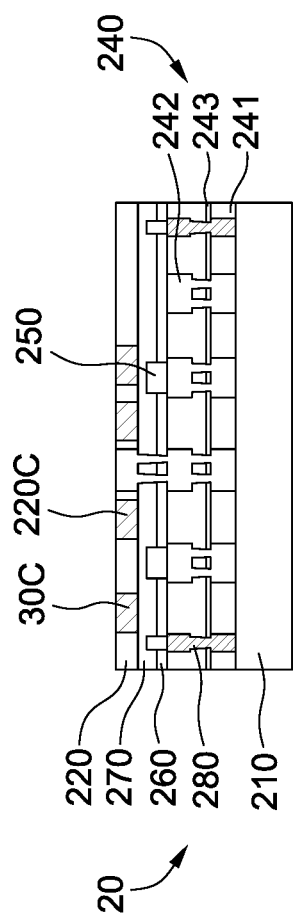

Referring to FIG. 10D, a gap-filling dielectric layer 270 may be formed to cover the conductive pads 250, a bonding layer 220 may be formed on the gap-filling dielectric layer 270, a conductive bump 80 may be formed within the bonding layer 220, and auxiliary bond pads 30C may be formed within the bonding layer 220. The auxiliary bond pads 30C may be or include dummy conductive pads. The bonding layer 220 may include an oxide based layer having an oxide based bonding surface. The conductive bump 80 and the auxiliary bond pads 30C may be exposed by an upper surface (e.g., the oxide based bonding surface) of the oxide based layer. In some embodiments, hybrid bond pads 220C may be formed within the bonding layer 220. The hybrid bond pads 220C may be exposed by an upper surface (e.g., the oxide based bonding surface) of the oxide based layer. As such, a device structure 20 may be formed.

Figure 10E:
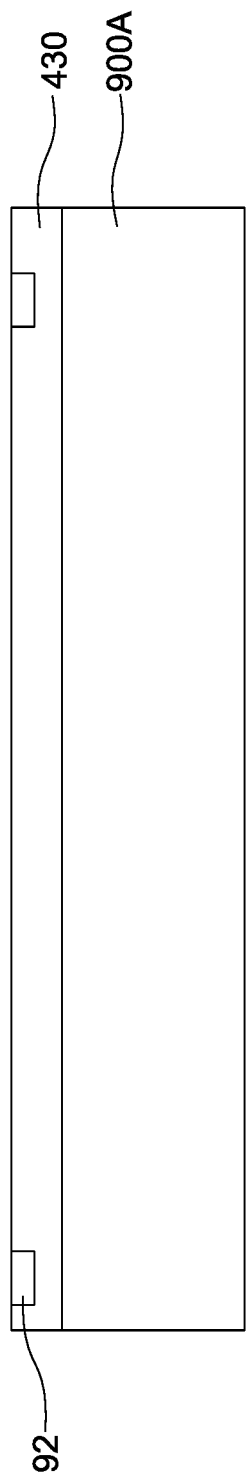

Referring to FIG. 10E, a carrier 900A may be provided, and a bonding layer 430 may be formed on the carrier 900A. The bonding layer 430 may include an oxide based layer having an oxide based bonding surface. An alignment mark 92 may be in the bonding layer 430.

Figure 10F:
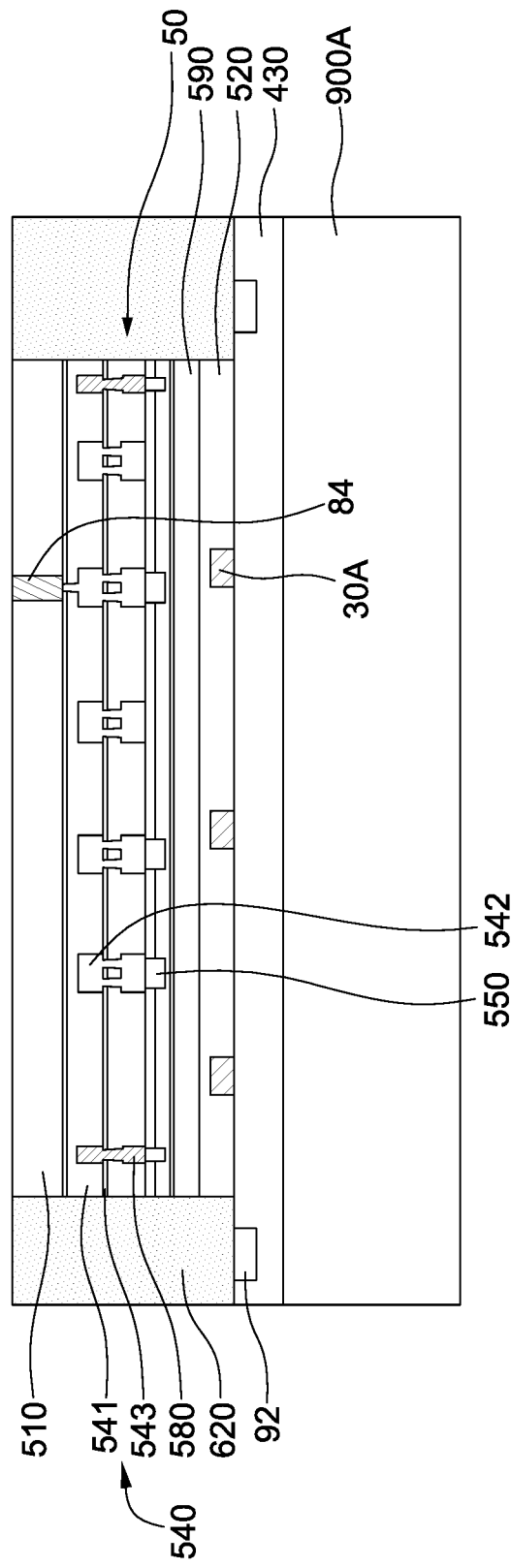

Referring to FIG. 10F, the device structure 50 may be bonded to the carrier 900A, a dielectric structure 620 may be formed to cover the bonding layer 430 and the device structure 50, and the semiconductor substrate 510 may be thinned to expose the conductive via 84. In some embodiments, the oxide based layer and the auxiliary bond pads 30A of the bonding layer 520 is bonded to the oxide based bonding surface of the bonding layer 430. In some embodiments, the bonding layer 520 is fusion-bonded to the bonding layer 430. In some embodiments, a CMP process may be performed to remove portions of the semiconductor substrate 510, the dielectric structure 620, and the conductive via 84A to expose a portion of the conductive via 84 from a surface of the semiconductor substrate 510.

In some embodiments, an auxiliary bond pad 30A is completely surrounded by dielectric material. For example, the auxiliary bond pad 30A may be completely surrounded by dielectric material of the bonding layer 520 and dielectric material of the bonding layer 430. In some embodiments, an auxiliary bond pad 30A is spaced completely from other conductive features (e.g., pads, wires, vias, etc.). In some embodiments, an auxiliary bond pad 30A is inset into one of the bonding layers 430, 520 and has a conductive surface facing the other one of the bonding layers 430, 520. In at least some of such embodiments, a majority or an entirety of the conductive surface directly contacts the other one of the bonding layers 430, 520 at an elevation level with a bond interface between the bonding layers 430, 520. The majority may, for example, be greater than 50%, 75%, 90%, or some other suitable percentage of a total surface area of the conductive surface of the auxiliary bond pad 30.

In some embodiments, the bonding is performed using water and/or using hydrophilic fusion bonding, and the auxiliary bond pads 30A react with the water to reduce water trapped at the bond interface between the bonding layers 430, 520. In some embodiments, an insignificant amount of trapped water molecules remains at the bond interface between the bonding layers 430, 520. In other embodiments, trapped water molecules are completely eliminated from the bond interface between the bonding layers 430, 520. In some embodiments, unreacted silanol groups persist at the bond interface between the bonding layers 430, 520.

Figure 10G:
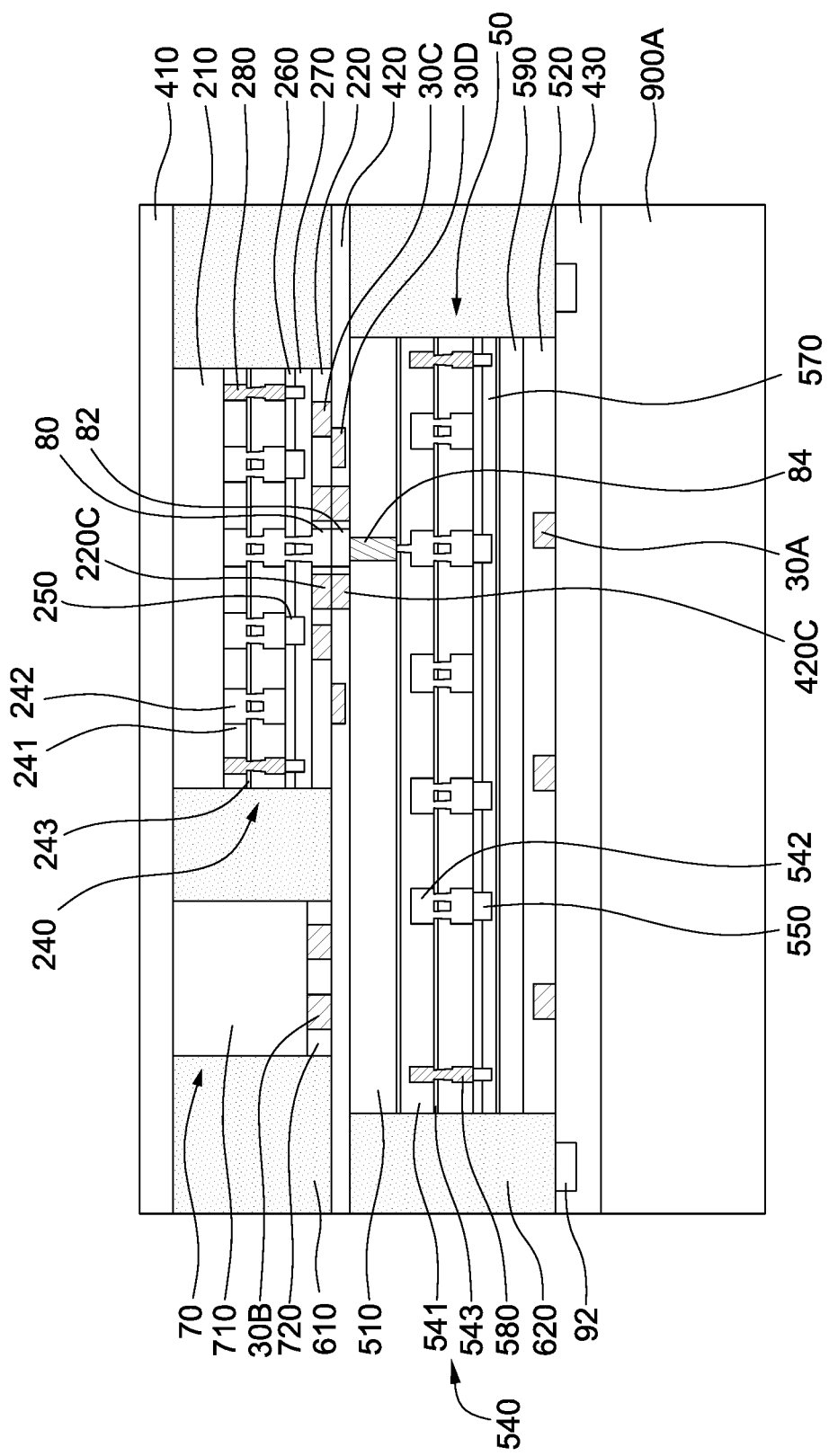

Referring to FIG. 10G, a bonding layer 420 may be formed on the semiconductor substrate 510 and the dielectric structure 620, auxiliary bond pads 30D may be formed within the bonding layer 420, a conductive bump 82 may be formed to penetrate the bonding layer 420 to connect to the conductive via 84, a support die 70 and the device structure 20 may be bonded to the device structure 50, and a bonding layer 410 may be formed on the dielectric structure 610, the device structure 20, and the support die 70. The auxiliary bond pads 30D may be or include dummy conductive pads.

In some embodiments, the bonding layer 420 includes an oxide based layer having an oxide based bonding surface. The conductive bump 82 and the auxiliary bond pads 30D may be exposed by a surface (e.g., the oxide based bonding surface) of the oxide based layer. In some embodiments, hybrid bond pads 420C may be formed within the bonding layer 420. The hybrid bond pads 420C may be exposed by an upper surface (e.g., the oxide based bonding surface) of the oxide based layer.

In some embodiments, the bonding layer 220 of the device structure 20 is bonded to the bonding layer 420. In some embodiments, the hybrid bond pads 220C are bonded to the hybrid bond pads 220C. In some embodiments, the bonding layer 220 of the device structure 20 is hybrid-bonded to the bonding layer 420. In some embodiments, the conductive bump 80 is bonded to the conductive bump 82.

In some embodiments, the support die 70 includes a body portion 710 and a bonding layer 720. The body portion 710 may include a semiconductor substrate including Si, Ge, SiGe, SiC, or other proper semiconductor materials. The body portion 710 may be a bulk substrate or constructed as an SOI substrate. The bonding layer 720 may include an oxide based layer having an oxide based bonding surface. Auxiliary bond pads 30B may be formed within the bonding layer 720. The auxiliary bond pads 30B may be exposed by an upper surface (e.g., the oxide based bonding surface) of the oxide based layer. The auxiliary bond pads 30B may be or include dummy conductive pads. In some embodiments, the oxide based layer and the auxiliary bond pads 30B of the bonding layer 720 are bonded to the oxide based bonding surface of the bonding layer 420. In some embodiments, the oxide based layer of the bonding layer 720 is bonded to the oxide based bonding surface of the bonding layer 420.

In some embodiments, an auxiliary bond pad (e.g., any of 30B, 30C, and 30D) is completely surrounded by dielectric material. For example, an auxiliary bond pad 30B may be completely surrounded by dielectric material, which includes dielectric material of the bonding layer 720 and dielectric material of the bonding layer 420. As another example, an auxiliary bond pad 30C or 30D may be completely surrounded by dielectric material, which includes dielectric material of the bonding layer 220 and dielectric material of the bonding layer 420. In some embodiments, an auxiliary bond pad (e.g., any of 30B, 30C, and 30D) is spaced completely from other conductive features (e.g., pads, wires, vias, etc.). In some embodiments, an auxiliary bond pad 30B is inset into one of the bonding layers 420, 720 and has a conductive surface facing the other one of the bonding layers 420, 720. In at least some of such embodiments, a majority or an entirety of the conductive surface directly contacts the other one of the bonding layers 420, 720 at an elevation level with a bond interface between the bonding layers 420, 720. The majority may, for example, be greater than 50%, 75%, 90%, or some other suitable percentage of a total surface area of the conductive surface of the auxiliary bond pad 30B. In some embodiments, an auxiliary bond pad (e.g., any of 30C and 30D) is inset into one of the bonding layers 220, 420 and has a conductive surface facing the other one of the bonding layers 220, 420. In at least some of such embodiments, a majority or an entirety of the conductive surface directly contacts the other one of the bonding layers 220, 420 at an elevation level with a bond interface between the bonding layers 220, 420. The majority may, for example, be as above.

In some embodiments, the bonding is performed using water and/or using hydrophilic fusion bonding. Further, the auxiliary bond pads 30B react with the water to reduce water trapped at the bond interface between the bonding layers 420, 720, and the auxiliary bond pads 30B and 30C react with the water to reduce water trapped at the bond interface between the bonding layers 220, 420. In some embodiments, an insignificant amount of trapped water molecules remains at the bond interface between the bonding layers 420, 720 and/or an insignificant amount of trapped water molecules remains at the bond interface between the bonding layers 220, 420. In some embodiments, trapped water molecules are completely eliminated from the bond interface between the bonding layers 420, 720, and/or trapped water molecules are completely eliminated from the bond interface between the bonding layers 220, 420. In some embodiments, unreacted silanol groups persist at the bond interface between the bonding layers 420, 720 and/or unreacted silanol groups persist at the bond interface between the bonding layers 220, 420.

Figure 10H:
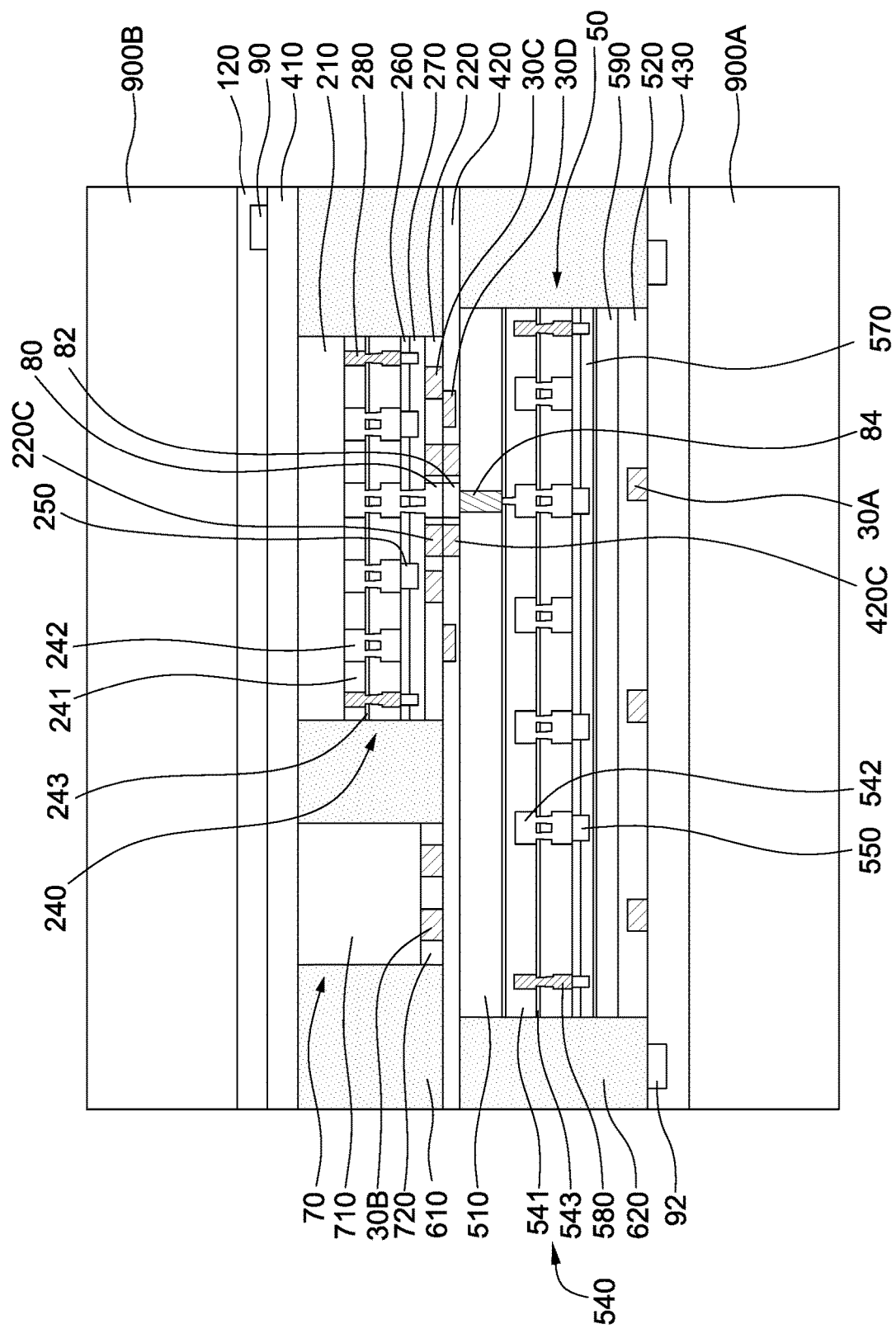

Referring to FIG. 10H, a bonding layer 120 may be formed or disposed on the bonding layer 410, and a carrier 900B may be formed or disposed on the bonding layer 120. The bonding layer 120 may include an oxide based layer having an oxide based bonding surface. In some embodiments, the oxide based layer of the bonding layer 120 is fusion-bonded to the oxide based bonding surface of the bonding layer 410. The carrier 900B may be a semiconductor substrate (e.g., the semiconductor substrate 110 illustrated in FIG. 7A).

Figure 10I:
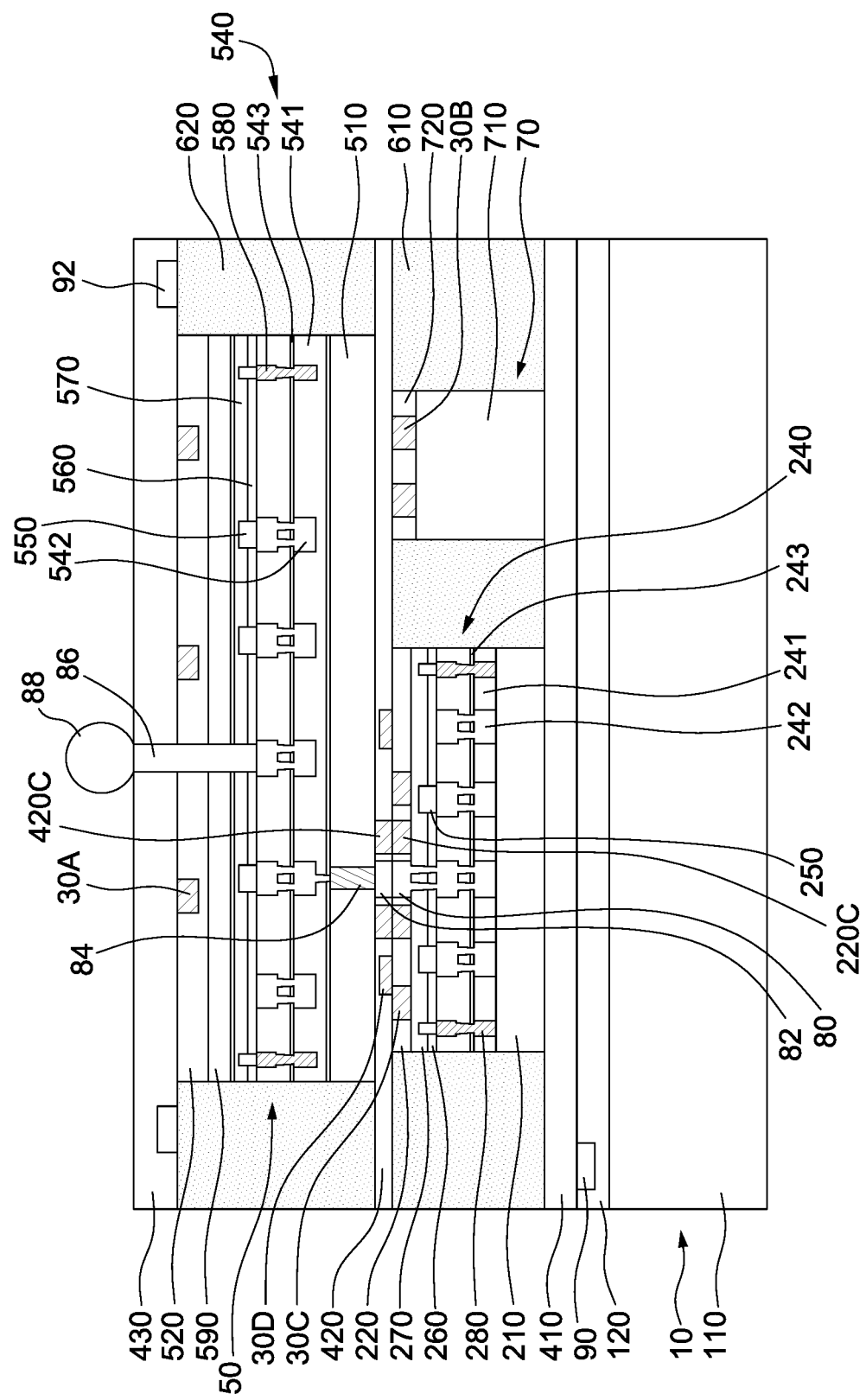

Referring to FIG. 10I, the structure illustrated in FIG. 10H may be flipped-over, the carrier 900A may be removed, a conductive via 86 may be formed to electrically connect to the device structure 50, and an electrical contact 88 may be formed to electrically connect to the conductive via 86. In some embodiments, the carrier 900A is removed by a CMP process to expose the bonding layer 430. In some embodiments, the conductive via 86 is formed penetrating the bonding layers 430, 520 and 590, the ESL, the gap-filling dielectric layer 570, and the passivation layer 560 to electrically connect to the RDL structure 540. As such, the semiconductor structure 7A is formed.

Some embodiments of the present disclosure provide a semiconductor structure, including: a first device structure including a first bonding layer; an oxide based layer bonded to the first bonding layer of the first device structure, and a first auxiliary bond pad at a bond interface between the oxide based layer and the first bonding layer of the first device structure; wherein the first auxiliary bond pad has a surface facing one of the oxide based layer and the first bonding layer, and wherein the one of the oxide based layer and the first bonding layer directly contacts a majority of the surface at an elevation level with the bond interface. In some embodiments, the semiconductor structure further includes an oxide segment proximal to the first auxiliary bond pad. In some embodiments, the first auxiliary bond pad is within a range covered by the first device structure from a top view perspective. In some embodiments, the first auxiliary bond pad is spaced apart from a boundary of the range covered by the first device structure by a distance of 0.1 μm or greater from a top view perspective. In some embodiments, the first auxiliary bond pad is inset into the oxide based layer, wherein the one of the oxide based layer and the first bonding layer is the first bonding layer. In some embodiments, the first auxiliary bond pad is free from contacting a conductive pad. In some embodiments, the semiconductor structure further includes a second device structure stacked over and connected to the first device structure through the oxide based layer and the first bonding layer. In some embodiments, the second device structure includes a second bonding layer on a side opposite the first device structure, wherein the semiconductor structure further includes a second auxiliary bond pad in the second bonding layer of the second device structure.

Some embodiments of the present disclosure provide another semiconductor structure, including: a first bonding layer including a first auxiliary bond pad; and a second bonding layer having an oxide based bonding surface bonded to the first bonding layer and further bonded to the first auxiliary bond pad; wherein the first auxiliary bond pad is completely surrounded by dielectric material, including dielectric material of the first bonding layer and dielectric material of the oxide based bonding surface of the second bonding layer. In some embodiments, each of the first bonding layer and the second bonding layer includes a hybrid bond layer or a fusion bond layer. In some embodiments, the second bonding layer includes a second auxiliary bond pad, wherein the first bonding layer has an oxide based bonding surface bonded to the second bonding layer and further bonded to the second auxiliary bond pad. In some embodiments, the second auxiliary bond pad is completely surrounded by dielectric material, including dielectric material of the second bonding layer and dielectric material of the oxide based bonding surface of the first bonding layer. In some embodiments, the semiconductor structure further includes: a first semiconductor device; and a second semiconductor device stacked over and bonded to the first semiconductor device through the first bonding layer and the second bonding layer. In some embodiments, the semiconductor structure further includes a support die stacked under the second semiconductor device and including a third bonding layer, wherein the third bonding layer includes a second auxiliary bond pad bonded to the oxide based bonding surface of the second bonding layer.

Some embodiments of the present disclosure provide a method of manufacturing a semiconductor structure, including: forming a first bonding layer over a first carrier, the first bonding layer including a first dummy conductive pad; forming a second bonding layer over a second carrier, the second bonding layer having an oxide based bonding surface; and bonding the first dummy conductive pad to the oxide based bonding surface of the second bonding layer; wherein the first dummy conductive pad has a conductive surface, and wherein a majority of the conductive surface faces and directly contacts the oxide based bonding surface during the bonding. In some embodiments, forming the first bonding layer includes: forming an oxide based layer over the first carrier; and forming the first dummy conductive pad within the oxide based layer and exposed by an upper surface of the oxide based layer. In some embodiments, the method further includes bonding the upper surface of the oxide based layer of the first bonding layer to the oxide based bonding surface of the second bonding layer. In some embodiments, forming the first bonding layer includes: forming a first hybrid bond pad within the oxide based layer and exposed by the upper surface of the oxide based layer, wherein the first hybrid bond pad is electrically coupled to a semiconductor device on the first carrier, and wherein an entirety of the conductive surface of the first dummy conductive pad faces and directly contacts the oxide based bonding surface. In some embodiments, the second bonding layer includes a second dummy conductive pad and a second hybrid bond pad exposed from the oxide based bonding surface, and the method further includes: bonding the second dummy conductive pad to the oxide based layer, wherein the second dummy conductive pad has a conductive surface facing the oxide based layer and completely and directly contacting the oxide based layer; and bonding the second hybrid bond pad to the first hybrid bond pad. In some embodiments, the second bonding layer includes a second dummy conductive pad exposed from the oxide based bonding surface, and the method further includes: bonding the second dummy conductive pad to the upper surface of the oxide based layer, wherein the second dummy conductive pad is spaced apart from the first dummy conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first device structure comprising a first bonding layer;
an oxide based layer bonded to the first bonding layer of the first device structure;
a first auxiliary bond pad at a bond interface between the oxide based layer and the first bonding layer of the first device structure; and
an oxide segment proximal to the first auxiliary bond pad and corresponding to an oxidized portion of the first auxiliary bond pad.

2. The semiconductor structure of claim 1, wherein the first auxiliary bond pad is within a range covered by the first device structure from a top view perspective.

3. The semiconductor structure of claim 2, wherein the first auxiliary bond pad is spaced apart from a boundary of the range covered by the first device structure by a distance of 0.1 µm or greater from a top view perspective.

4. The semiconductor structure of claim 1, wherein the first auxiliary bond pad is inset into the oxide based layer.

5. The semiconductor structure of claim 1, wherein the first auxiliary bond pad is free from contacting a conductive pad.

6. The semiconductor structure of claim 1, further comprising:
a second device structure stacked over and connected to the first device structure through the oxide based layer and the first bonding layer.

7. The semiconductor structure of claim 6, wherein the second device structure comprises a second bonding layer on a side opposite the first device structure, and wherein the semiconductor structure further comprises:
a second auxiliary bond pad in the second bonding layer of the second device structure.

8. A semiconductor structure, comprising:
a first bonding layer comprising a first auxiliary bond pad; and
a second bonding layer having an oxide based bonding surface bonded to the first bonding layer and further bonded to the first auxiliary bond pad;
wherein the first auxiliary bond pad is completely surrounded by dielectric material, including dielectric material of the first bonding layer and dielectric material of the oxide based bonding surface of the second bonding layer.

9. The semiconductor structure of claim 8, wherein each of the first bonding layer and the second bonding layer comprises a hybrid bond layer or a fusion bond layer.

10. The semiconductor structure of claim 8, wherein the second bonding layer comprises a second auxiliary bond pad, and wherein the first bonding layer has an oxide based bonding surface bonded to the second bonding layer and further bonded to the second auxiliary bond pad.

11. The semiconductor structure of claim 10, wherein the second auxiliary bond pad is completely surrounded by dielectric material, including dielectric material of the second bonding layer and dielectric material of the oxide based bonding surface of the first bonding layer.

12. The semiconductor structure of claim 8, further comprising:
a first semiconductor device; and
a second semiconductor device stacked over and bonded to the first semiconductor device through the first bonding layer and the second bonding layer.

13. The semiconductor structure of claim 12, further comprising:
a support die stacked under the second semiconductor device and comprising a third bonding layer, wherein the third bonding layer comprises a second auxiliary bond pad bonded to the oxide based bonding surface of the second bonding layer.

14. A method of manufacturing a semiconductor structure, comprising:
- forming a first bonding layer over a first carrier, the first bonding layer comprising a first dummy conductive pad;
- forming a second bonding layer over a second carrier, the second bonding layer having an oxide based bonding surface; and
- bonding the first dummy conductive pad to the oxide based bonding surface of the second bonding layer;
- wherein the first dummy conductive pad has a conductive surface, and wherein a majority of the conductive surface faces and directly contacts the oxide based bonding surface during the bonding.

15. The method of claim 14, wherein forming the first bonding layer comprises:
- forming an oxide based layer over the first carrier; and
- forming the first dummy conductive pad within the oxide based layer and exposed by an upper surface of the oxide based layer.

16. The method of claim 15, further comprising bonding the upper surface of the oxide based layer of the first bonding layer to the oxide based bonding surface of the second bonding layer.

17. The method of claim 15, wherein forming the first bonding layer comprises:
- forming a first hybrid bond pad within the oxide based layer and exposed by the upper surface of the oxide based layer, wherein the first hybrid bond pad is electrically coupled to a semiconductor device on the first carrier, and wherein an entirety of the conductive surface of the first dummy conductive pad faces and directly contacts the oxide based bonding surface.

18. The method of claim 17, wherein the second bonding layer comprises a second dummy conductive pad and a second hybrid bond pad exposed from the oxide based bonding surface, and the method further comprises:
- bonding the second dummy conductive pad to the oxide based layer, wherein the second dummy conductive pad has a conductive surface facing the oxide based layer and completely and directly contacting the oxide based layer; and
- bonding the second hybrid bond pad to the first hybrid bond pad.

19. The method of claim 15, wherein the second bonding layer comprises a second dummy conductive pad exposed from the oxide based bonding surface, and the method further comprises:
- bonding the second dummy conductive pad to the upper surface of the oxide based layer, wherein the second dummy conductive pad is spaced apart from the first dummy conductive pad.

20. The semiconductor structure of claim 1, wherein the first auxiliary bond pad has a conductive surface, and wherein a majority of the conductive surface faces and contacts an oxide based bonding surface of the oxide based layer or the first bonding layer.

* * * * *